(12) United States Patent
Chang et al.

(10) Patent No.: US 10,727,279 B2
(45) Date of Patent: Jul. 28, 2020

(54) ORGANIC LIGHT EMITTING DIODE DISPLAY DEVICE

(71) Applicant: LG Display Co., Ltd., Seoul (KR)

(72) Inventors: Su-Jin Chang, Paju-si (KR); Ji-Su Yoon, Paju-si (KR); Je-Beom Park, Paju-si (KR); Dong-Ryul Jung, Paju-si (KR); Kyu-Oh Kwon, Paju-si (KR); Min-Jae Kang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/215,658

(22) Filed: Dec. 11, 2018

(65) Prior Publication Data

US 2019/0181189 A1 Jun. 13, 2019

(30) Foreign Application Priority Data

Dec. 11, 2017 (KR) .................. 10-2017-0169326
Sep. 17, 2018 (KR) .................. 10-2018-0110904

(51) Int. Cl.
*H01L 27/32* (2006.01)
*H01L 51/52* (2006.01)

(52) U.S. Cl.
CPC ........ *H01L 27/3213* (2013.01); *H01L 27/322* (2013.01); *H01L 27/3244* (2013.01); *H01L 51/5284* (2013.01)

(58) Field of Classification Search
CPC ............ H01L 27/3213; H01L 27/322; H01L 27/3244; H01L 51/5284
See application file for complete search history.

(56) References Cited

U.S. PATENT DOCUMENTS

| 6,836,383 | B1 * | 12/2004 | Ozawa | G02B 5/223 359/885 |
|---|---|---|---|---|
| 2003/0230972 | A1 * | 12/2003 | Cok | H01L 27/3211 313/504 |
| 2004/0183767 | A1 * | 9/2004 | Koo | G09F 9/30 345/92 |
| 2005/0046321 | A1 * | 3/2005 | Suga | G02B 5/0226 313/112 |
| 2006/0006797 | A1 * | 1/2006 | Ito | G02F 1/133603 313/506 |
| 2011/0198629 | A1 * | 8/2011 | Lee | H01L 27/3213 257/89 |

* cited by examiner

*Primary Examiner* — Kyoung Lee
*Assistant Examiner* — Christina A Sylvia
(74) *Attorney, Agent, or Firm* — Fenwick & West LLP

(57) ABSTRACT

An organic light emitting diode (OLED) display device includes an OLED with a plurality of sub-pixels. A first portion of light-absorption filter layer is between the OLED and an emission surface at locations corresponding to selected sub-pixel locations. The first portion of light-absorption filter layer includes a first light-absorption dye and a second light-absorption dye such that the first portion has a light transmittance curve that has a first valley between 470 nm and 550 nm and has a second valley between 570 nm and 620 nm. At the selected sub-pixel locations, there is a color filter between the OLED and the light-absorption filter.

18 Claims, 10 Drawing Sheets

ORGANIC LIGHT EMITTING DIODE DISPLAY DEVICE

CROSS-REFERENCE TO RELATED APPLICATIONS

The present application claims the priority from and the benefit of Republic of Korea Patent Application Nos. 10-2017-0169326 and 10-2018-0110904 filed in Republic of Korea on Dec. 11, 2017 and Sep. 17, 2018, respectively, which are hereby incorporated by reference in its entirety.

BACKGROUND

Technical Field

The present disclosure relates to an organic light emitting diode display (OLED), and particularly, to an OLED that can improve a color reproduction range.

Discussion of the Related Art

With the advent of the information society, information display devices for processing and displaying a large amount of information have been drawing interest, including for application in portable information devices. Accordingly, various types of flat display devices of lightweight and thin profile have been developed and spotlighted.

For example, the types of flat display devices include a liquid crystal display device (LCD), a plasma display panel device (PDP), a field emission display device (FED), an electroluminescent display device (ELD), and an organic light emitting diode display device (OLED). These flat display devices have advantages of thin profile, lightweight, low power consumption, and the like, and therefore have replaced cathode ray tube (CRT) devices rapidly.

Among the flat display devices, the OLED is a self-luminescent device. As such, it can be lightweight and have a thin profile because it does not require a backlight used, for example, to supply light in the LCD.

Further, compared with the LCD, the OLED has advantages of an excellent viewing angle and contrast ratio, low power consumption, operation in low DC voltage, a fast response speed, being equipped to withstand an external impact because of its solid internal components, and a wide operating temperature range.

In addition, since processes of manufacturing the OLED are relatively simple, a production cost of the OLED can be reduced in comparison with that of the LCD.

The OLED includes a unit pixel having red, green and blue sub-pixels, and the red, green and blue sub-pixels include organic light emitting layers emitting red, green and blue lights, respectively. The OLED displays an image by a mixture of the color lights from the red, green and blue sub-pixels.

Since the red, green and blue organic light emitting layers are made of different materials, they have different properties. Accordingly, the red, green and blue sub-pixels have different light emission efficiencies and different lifetimes.

To solve this problems, an OLED using color filters have been suggested.

In this OLED, red, green and blue sub-pixels each include an organic light emitting layer emitting a white light, and include red, green and blue color filters, respectively. Accordingly, a white light from each of the red, green and blue sub-pixels passes through each of the red, green and blue color filters and be output as each red, green and blue lights, and thus an image is displayed through a combination of the red, green and blue lights.

However, the OLED using the red, green and blue color filters has a problem of low color reproduction range.

In this regard, a white light produced from a backlight unit of an LCD and a white light produced from an organic light emitting diode are different in peak positions and band widths of red, green and blue lights. Thus, red, green and blue color filters optimized for a white light from the backlight unit of the LCD reduces a color reproduction range of the OLED.

SUMMARY

Accordingly, the present disclosure is directed to an OLED that substantially obviates one or more of the problems due to limitations and disadvantages of the related art.

An aspect of the present disclosure is to provide an OLED that can improve a color reproduction range and a light efficiency.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other advantages, and in accordance with the purpose of the present disclosure, as embodied and broadly described herein, a display device includes an organic light emitting diode (OLED) with a first electrode common to at least a subset of sub-pixels, second electrodes individually connected to each of the sub-pixels, and an organic light emitting layer between the first electrode and the second electrodes. The display device has a first portion of light-absorption filter layer between the OLED and the emission surface in a subset of sub-pixels, where the first portion has a first valley covering at least a wavelength range of 470 nm to 550 nm, and a second valley covering at least a wavelength range of 570 nm to 620 nm. The display device includes a color filter between the OLED and the first portion of the light-absorption filter layer in the subset of sub-pixels.

To achieve these and other advantages, and in accordance with the purpose of the present disclosure, as embodied and broadly described herein, a method of operating a display device includes producing light at sub-pixels, each of the sub-pixels including an organic light emitting diode (OLED). The produced light from a subset of the sub-pixels is passed through color filters to produce first filtered light. The first filtered light is passed through a first portion of a light-absorption filter layer having a light transmittance curve that has a first valley covering at least a wavelength range of 470 nm to 550 nm, and a second valley covering at least a wavelength range of 570 nm to 620 nm to produce second filtered light. At least a part of the second filtered light through an emission surface of the display device is emitted through an emission surface of the display device.

It is to be understood that both the foregoing general description and the following detailed description are exemplary and explanatory, and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain various principles of the disclosure. In the drawings.

DETAILED DESCRIPTION

Reference will now be made in detail to embodiments, examples of which are illustrated in the accompanying drawings. The same or like reference numbers may be used throughout the drawings to refer to the same or like parts.

First Embodiment

Figure 1:
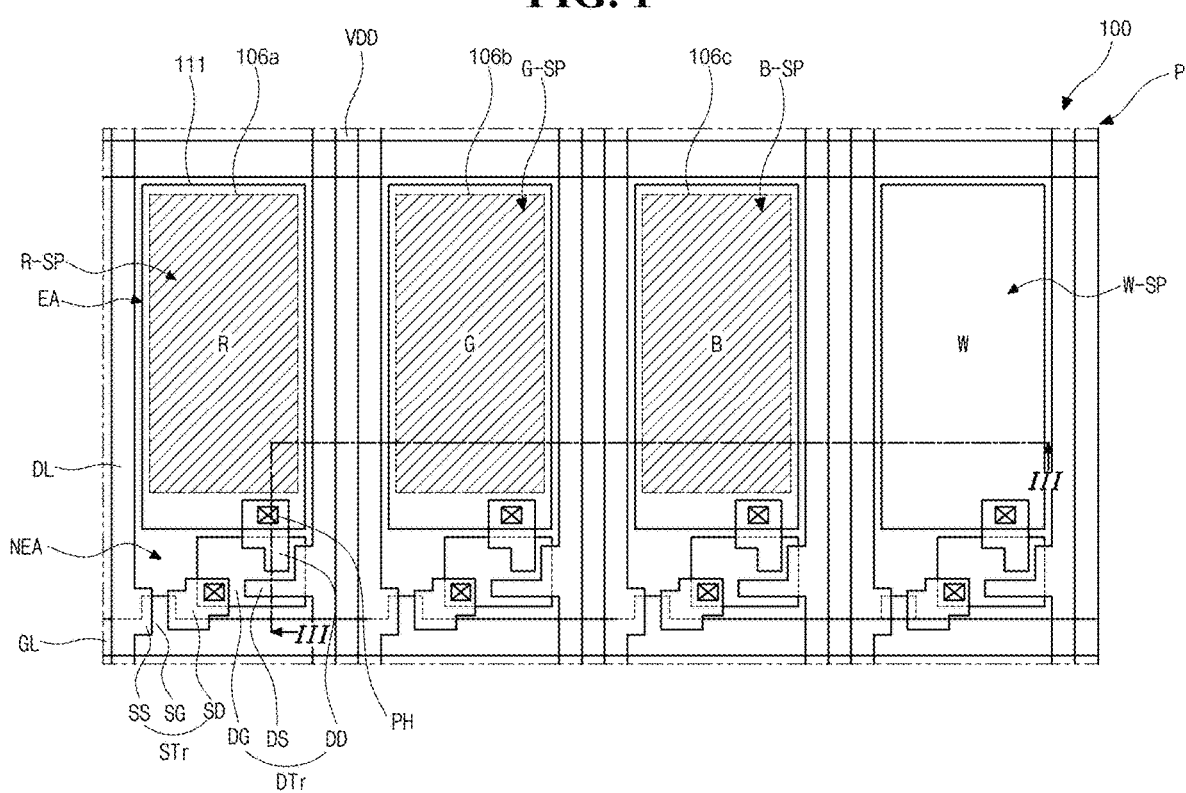
FIG. 1 is a plan view illustrating a structure of a unit pixel including four sub-pixels in an OLED according to a first embodiment of the present disclosure.
Figure 2:
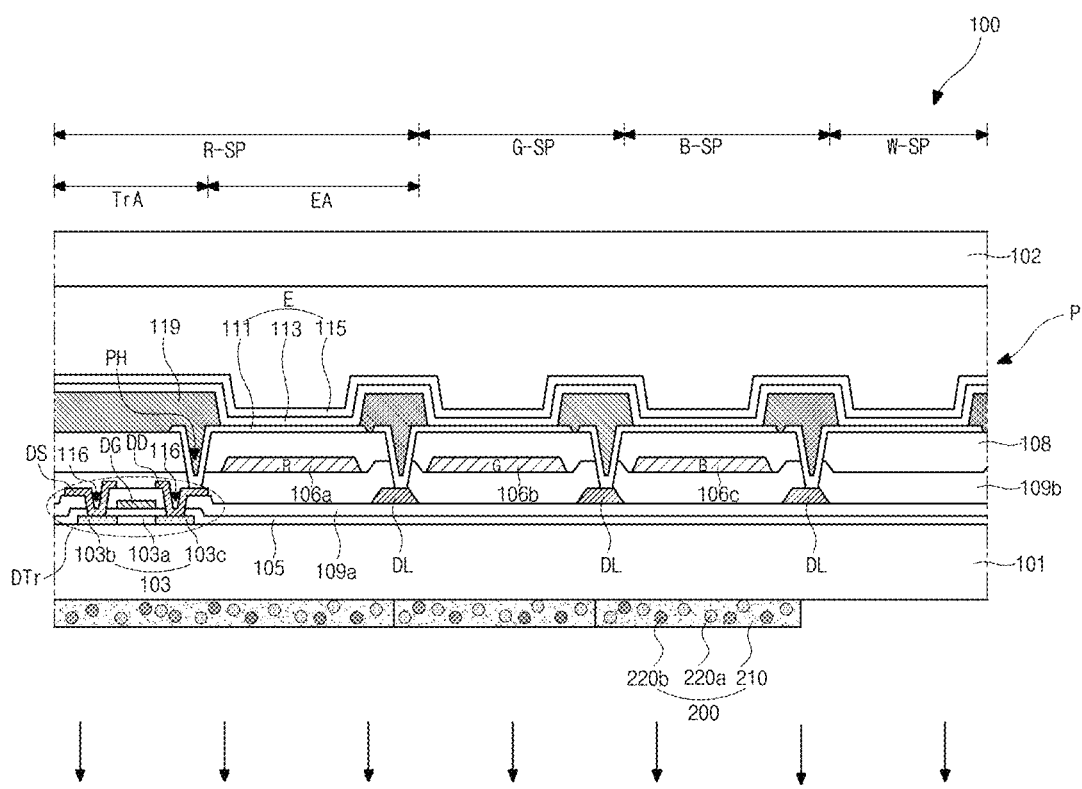
FIG. 2 is a cross-sectional view taken along a line of FIG. 1.

FIG. 1 is a plan view illustrating a structure of a unit pixel including four sub-pixels in an OLED according to a first embodiment of the present disclosure. FIG. 2 is a cross-sectional view taken along a line II-II of FIG. 1.

The OLED 100 may be a top emission type display device or bottom emission type display device according to a transmission direction (or output direction) of an emitted light. A bottom emission type OLED 100 is described by way of example.

As illustrated in FIGS. 1 and 2, a unit pixel P of the OLED 100 may include red, green, blue and white sub-pixels R-SP, G-SP, B-SP and W-SP. Each sub-pixel may include an emission region EA, and a bank 119 may be located along a peripheral portion of the emission region EA. A non-emission region NEA may be defined at the bank 119.

For the purpose of explanations, the four sub-pixels R-SP, G-SP, and B-SP arranged in parallel with the same width are shown by way of example. However, the sub-pixels R-SP, G-SP, and B-SP may have different configurations with different widths.

A switching thin film transistor (TFT) STr and a driving TFT DTr may be formed at the non-emission region NEA of each sub-pixel. At the emission region EA of each sub-pixel, a light emitting diode E including a first electrode 111, an organic light emitting layer 113, and a second electrode 115 may be formed.

The emission regions EA of the red, green, blue and white sub-pixels R-SP, G-SP, B-SP and W-SP emits red, green, blue and white lights, respectively. To do this, red, green and blue color filters 106a, 106b and 106c are located at the emission regions EA of the red, green and blue sub-pixels R-SP, G-SP and B-SP, respectively, and at the white sub-pixel W-SP, a white light emitted from the organic light emitting layer 113 is transmitted.

The switching TFT STr and the driving TFT DTr may be connected to each other, and the driving TFT DTr may be connected to the light emitting diode E.

A gate line SL, a data line DL, and a power line VDD may be arranged on a substrate 101 to define each of the sub-pixels R-SP, G-SP, B-SP and W-SP.

The switching TFT STr may be formed at the crossing portion of the gate line GL and the data line DL, and may function to select the corresponding sub-pixel.

The switching TFT STr may include a gate electrode SG branching off from the gate line SL, a semiconductor layer, a source electrode SS, and a drain electrode SD.

The driving TFT DTr may function to operate the light emitting diode E of the sub-pixel selected by the corresponding switching TFT STr. The driving TFT DTr may include a gate electrode DG connected to the drain electrode SD of the switching TFT STr, a semiconductor layer 103, a source electrode DS connected to the power line VDD, and a drain electrode DD.

The drain electrode DD of the driving TFT DTr may be connected to the first electrode 111 of the light emitting diode E.

The organic light emitting layer 113 may be interposed between the first and second electrodes 111 and 115.

The semiconductor layer 103 may be located at a switching region TrA of each sub-pixel. The semiconductor layer 103 may be made of silicon, and may include an active region 103a as a channel at a center portion thereof, and source and drain regions 103b and 103c, highly doped with impurities, at both sides of the active region 103a.

A gate insulating layer 105 may be formed on the semiconductor layer 103.

The gate electrode DG may be formed on the gate insulating layer 105 corresponding to the active region 103a. The gate line GL extending along a direction may be formed on the gate insulating layer 103.

A first inter-layered insulating layer 109a may be located on the gate electrode DG and the gate line GL. The first inter-layered insulating layer 109a and the gate insulating layer 105 may include first and second semiconductor contact holes 116 exposing the source and drain regions 103b and 103c, respectively.

The source and drain electrodes DS and DD may be formed on the first inter-layered insulating layer 109a and be spaced apart from each other. The source and drain electrodes DS and DD may contact the source and drain regions 103b and 103c through the first and second semiconductor contact holes 116, respectively.

A second inter-layered insulating layer 109b may be formed on the source and drain electrodes DS and DD, and the first inter-layered insulating layer 109a.

The source and drain electrodes DS and DD, the semiconductor layer 103, and the gate electrode DG, and the gate insulating layer 105 on the semiconductor layer 103 may form the driving TFT DTr.

Even though not shown in FIG. 2, the switching TFT STr may have substantially the same structure as the driving TFT DTr.

The driving TFT DTr having a top gate structure with the semiconductor layer 103 formed as a polycrystalline silicon layer or oxide semiconductor layer is described by way of example. Alternatively, the driving TFT DTr and the switching TFT STr may have a bottom gate structure with the semiconductor layer 103 formed as an amorphous silicon layer.

If the semiconductor layer 103 uses an oxide semiconductor layer, a light shielding layer may be formed below the semiconductor layer 103, and a buffer layer may be formed between the light shielding layer and the semiconductor layer 103.

The color filters 106a, 106b and 106c may be formed on the second inter-layered insulating layer 109b corresponding to the respective emission regions EA of the red, green and blue sub-pixels R-SP, G-SP and B-SP.

The color filters 106a, 106b and 106c function to convert a white light emitted from the respective organic light emitting layers 113. The red, green and blue color filters 106a, 106b and 106c are located at the emission regions EA of the red, green and blue sub-pixels R-SP, G-SP and B-SP, respectively.

At the emission region EA of the white sub-pixel W-SP, no color filter is formed, and a white light from the organic light emitting layer 113 is intactly transmitted.

Accordingly, in the OLED 100, the red, green, blue and white sub-pixels R-SP, G-SP, B-SP and W-SP emit red, green, blue and white colors so that a full color image of high brightness can be achieved.

An overcoat layer 108 may be formed on the color filters 106a, 106b and 106c. The overcoat layer 108 and the second inter-layered insulating layer 109b may have a drain contact hole PH exposing the drain electrode DD of the driving TFT DTr.

The first electrode 111 is formed on the overcoat layer 108. The first electrode 111 is connected to the drain electrode DD of the driving TFT DTr through the drain contact hole PH. The first electrode 111 may be made of a material having a relatively high work function and serve as an anode.

The first electrode 111 may be made of a metal oxide material, for example, ITO, IZO or the like.

Each first electrode 111 may be patterned by each sub-pixel and be formed in each sub-pixel. The bank 119 may be located between the neighboring first electrodes 111. The first electrodes 111 may be separated from each other with the bank 119 as a boundary of each sub-pixel.

The bank 119 may be located between the neighboring first electrodes 111 and may separate the neighboring first electrodes 111 from each other.

The organic light emitting layer 113 may be formed on the first electrode 111. The organic light emitting layer 113 may be configured with a single layer made of an emitting material. Alternatively, to increase an emission efficiency, the organic light emitting layer 113 may be configured with multiple layers that may include a hole injection layer, a hole transport layer, an emitting material layer, an electron transport layer, and an electron injection layer.

The second electrode 115 may be formed entirely on the organic light emitting layer 113. The second electrode 115 may serve as a cathode.

The second electrode 115 may be made of a material having a relatively low work function. The second electrode 115 may be formed with a single layer or multiple layers using a first metal such as Ag and a second metal such as Mg, and the single layer may be made of an alloy of the first and second metals at a predetermined ratio thereof.

In the OLED 100, when predetermined voltages are applied to the first electrode 111 and the second electrode 115, holes injected from the first electrode 111 and electrons injected from the second electrode 115 are transported to the organic light emitting layer 113 to form excitons. When the excitons are transitioned from an excited state to a ground state, light is generated and emitted in the form of visible light.

As the OLED 100 of this embodiment is a bottom emission type display device. In this case, the second electrode 115 may further include a reflective layer (not shown) made of an opaque conductive material. For example, the reflective layer may be made of an aluminum-palladium-copper (APC) alloy, and the second electrode 115 may have a triple-layered structure of, for example, ITO/APC/ITO. Further, the first electrode 111 may have a thin thickness to transmit a light, and in this case, a light transmittance of the first electrode 111 may be about 45% to 50%.

The protective film 102 in the form of a thin film may be formed on the second electrode 115, and the OLED 100 may be encapsulated by the protective film 102.

The protective film 102 may be formed with at least two inorganic protective films to prevent or reduce external oxygen or moisture from permeating inside the OLED 100. In this case, the protective film 102 may further include an organic protective film between two inorganic protective films to supplement an impact resistance of the inorganic protective films.

In the structure that the organic protective film and the inorganic protective film are alternately stacked, in order to prevent an moisture or oxygen from permeating through a side surface of the organic protective film, the inorganic protective film may be formed to fully enclose the organic protective film.

Accordingly, an external moisture or oxygen can be prevented from permeating inside the OLED 100.

In the OLED 100 of this embodiment, a light-absorption filter layer 200 may be further formed on an outer side of the substrate 101.

The light-absorption filter layer 200 may include first light-absorption dyes 220a and second light-absorption dyes 220b in a transparent resin 210. The first light-absorption dye 220a may has an absorption wavelength range of about 470 nm to 550 nm, and preferably, an absorption wavelength range of about 490 nm. The second light-absorption dye 220b may has an absorption wavelength range of about 570 nm to 620 nm, and preferably, an absorption wavelength range of about 590 nm.

The transparent resin 210 may be made of a binder resin. For example, the transparent resin 210 may be made of at least one selected from a group consisting of a polyester based binder resin, an acryl based binder resin, a polyurethane based binder resin, a melamine based binder resin, a polyvinyl alcohol based binder resin and a oxazoline based binder resin. Preferably, the transparent resin 210 may be made of an acryl based binder resin.

The first light-absorption dye 220a may be formed of pyrrol methin (PM) based light-absorption dye, rhodamin (RH) based light-absorption dye, or boron dipyrromethene (BODIBY) based light-absorption dye. The second light-absorption dye 220b may be formed of tetra aza porphyrin (TAP) based light-absorption dye, squarine (SQ) based light-absorption dye, or cyanine (CY) based light-absorption dye. Each of the first and second light-absorption dyes 220a and 220b may preferably use a combination of at least two selected from a group consisting of pyrrol methin (PM) based light-absorption dye, rhodamin (RH) based light-absorption dye, cyanine (CY) based light-absorption dye and tetra aza porphyrin (TAP) based light-absorption dye, and more preferably use a combination of cyanine (CY) based light-absorption dye and tetra aza porphyrin (TAP) based light-absorption dye.

The light-absorption filter layer 200 may correspond to the red, green and blue sub-pixels R-SP, G-SP and B-SP except for the white sub-pixel W-SP and be located on a transmission direction of lights which pass through the color filters 106a, 106b and 106c. Thus, the light-absorption filter layer 200 does not influence the white sub-pixel W-SP which much influences a brightness of the OLED 100, and improves a color reproduction range of lights emitted from the red, green and blue sub-pixels R-SP, G-SP and B-SP. In the example shown in FIG. 2, lights emitted from the red, green, and blue sub-pixels R-SP, G-SP, and B-SP are emitted through an emission surface on the light-absorption filter layer 200 while light emitted from the white sub-pixel W-SP is emitted through an emission surface on the substrate 101.

Accordingly, the OLED 100 of this embodiment can achieve a high brightness without loss of light and improve a color reproduction range, and thus can satisfy 80% or more for BT. 2020.

Figure 3A:
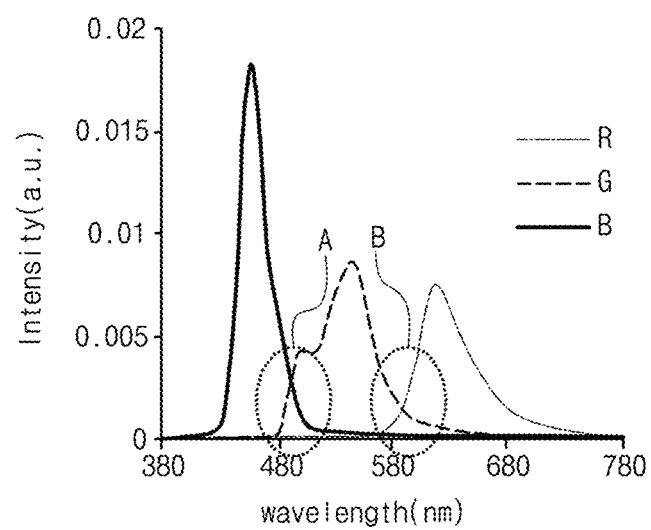
FIG. 3A is a graph showing transmission spectrums of red, green and blue lights transmitted through red, green and blue sub-pixels.

This refers to FIG. 3A that is a graph showing transmission spectrums of red, green and blue lights which are transmitted through red, green and blue sub-pixels. Lights transmitted at the red, green and blue sub-pixels R-SP, G-SP and B-SP passes through the red, green and blue color filters 106a, 106b and 106c, respectively. Accordingly, a blue light having a wavelength region of about 380 nm to 560 nm is emitted from the blue sub-pixel B-SP, a green light having a wavelength region of about 460 nm to 6300 nm is emitted from the green sub-pixel B-SP, and a red light having a wavelength region of about 580 nm to 780 nm is emitted from the red sub-pixel R-SP.

A color mixing region where two colors are simultaneously transmitted exists between transmission spectrums of the red, green and blue lights. Thus, the red, green and blue lights include a wavelength region where they overlaps each other.

For example, a first color mixing region A where the blue light and the green light all are transmitted exists at a range of about 470 nm to 550 nm, and thus the blue light transmitted at the blue sub-pixel B-SP may not be a pure blue light but be recognized as a blue light mixed with a green light. This phenomenon also happens to a second color mixing region B between the green light and the blue light.

As a result, the OLED 100 may have a disadvantage of a low color reproduction range for emitted colors.

Figure 3B:
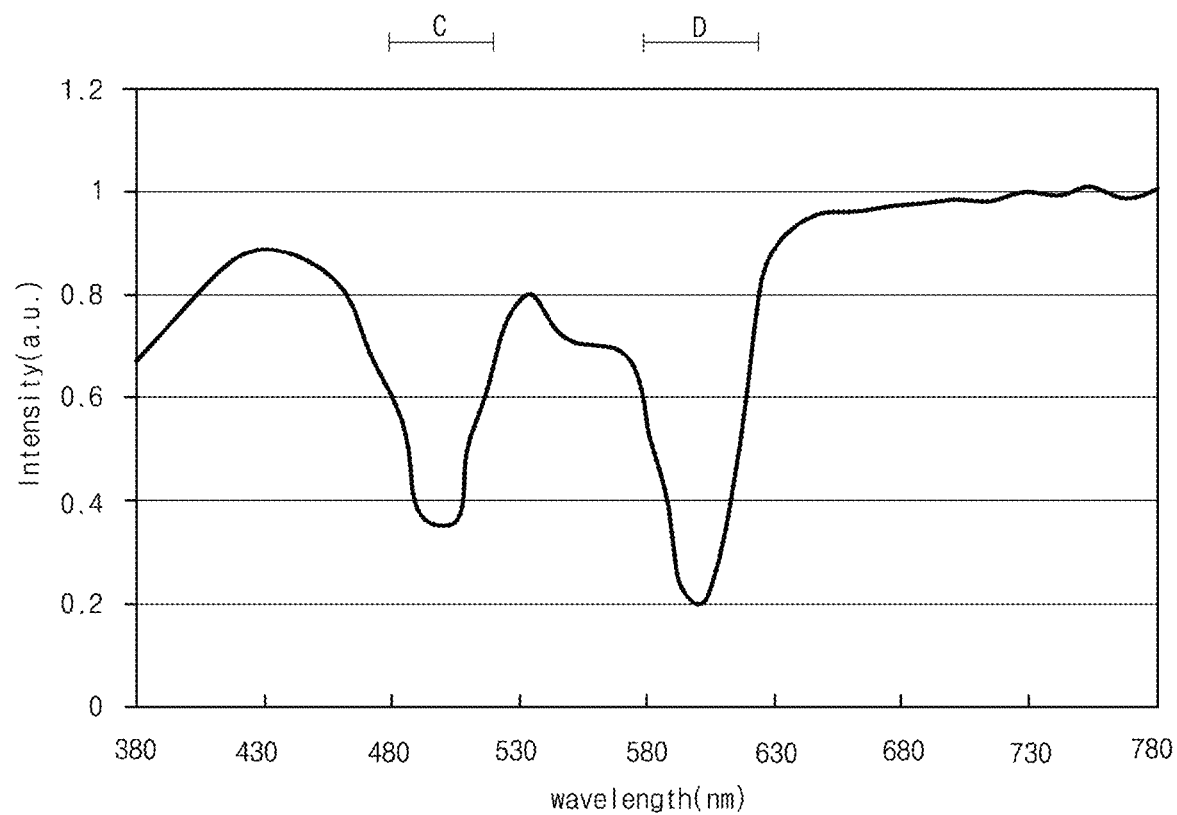
FIG. 3B is a graph showing a light transmission spectrum for a light-absorption filter layer.

FIG. 3B is a graph showing a light transmission spectrum for the light-absorption filter layer 200. Referring to FIG. 3B, it is seen that a transmittance of a light passing through the light-absorption filter layer 200 is reduced at a first valley C and a second valley D.

The first valley C covers a wavelength range of about 470 nm to 550 nm, and a light of the wavelength range of 470 nm to 550 nm may be absorbed by the first light-absorption dyes 220a contained in the light-absorption filter layer 200. The second valley Ds covers a wavelength range of about 570 nm to 620 nm, and a light of the wavelength range of 570 nm to 620 nm may be absorbed by the second light-absorption dyes 220b contained in the light-absorption filter layer 200. Thus, a transmittance of the wavelength range corresponding to the first and second valleys C and D is reduced.

Figure 3C:
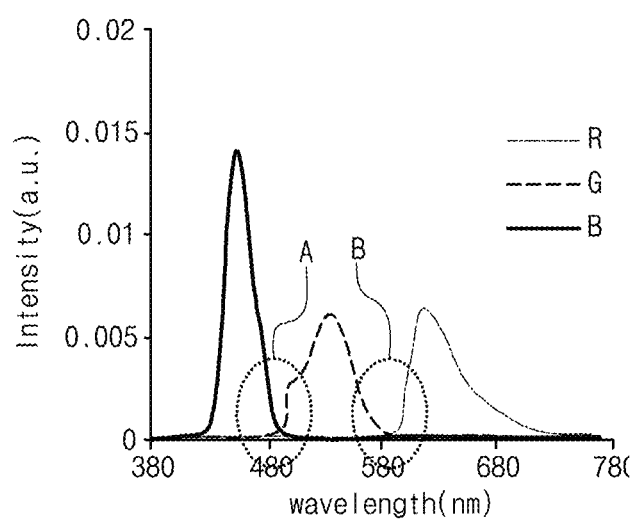
FIG. 3C is a graph showing transmission spectrums of lights transmitted through an OLED 100 according to a first embodiment of the present disclosure.

As described above, in this embodiment, the light-absorption filter layer 200 is located to correspond to the red, green and blue sub-pixels R-SP, G-SP and B-SP and be on the traveling direction of lights passing through the color filters 106a, 106b and 106c of the sub-pixels R-SP, G-SP and B-SP. Accordingly, referring to FIG. 3C which is a graph showing transmission spectrums of lights transmitted through the OLED 100, it is seen that red, green and blue lights output from the red, green and blue sub-pixels R-SP, G-SP and B-SP do not exist at the first and second color mixing regions A and B.

In other words, it is seen that the first color mixing region A generated in a range of about 470 nm to 550 nm between the blue light and the green light, and the second color mixing region B generated in a range of about 570 nm to 620 nm between the green light and the red light are removed.

This means that, due to a light-absorption property of the light-absorption filter layer 200, a pure blue light not mixed with a green light is output from the blue sub-pixel B-SP, a pure red light not mixed with a green light is output from the red sub-pixel R-SP, and a pure green light not mixed with a blue light and a red light is output from the green sub-pixel G-SP.

As described above, in this embodiment, the light-absorption filter layer 200 is used. Accordingly, a pure red light is output from the red sub-pixel R-SP, a pure green light is output from the green sub-pixel G-SP, and a pure blue light is output from the blue sub-pixel B-SP. Thus, color reproduction range of lights passing through the red, green and blue sub-pixels R-SP, G-SP and B-SP can be improved.

Therefore, the OLED 100 of this embodiment can achieve 80% or more for BT. 2020.

Prior to improvement of a color reproduction range in experimental results explained below, a color gamut and a color reproduction range (CRR) may be defined or explained below.

The color gamut is to represent physical characteristics relevant to a color expression of a device acquiring, processing or outputting an image as a figure (mostly a triangle) shown on a color coordinate. A representative color gamut is NTSC, BT. 709, sRGB, Adobe RGB, DCI, BT. 2020 or the like.

In this embodiment, a color reproduction range is explained based on BT. 2020 used for a color reproduction range of a next-generation display device. BT. 2020 is a standard of 4K/UHD advised by ITU, and has a color reproduction region much broader than NTSC, Adobe RGB, DCI and sRGB.

A value that is a ratio (%) of a color gamut area relative to a reference color gamut area may be referred to as a color reproduction range. In this embodiment, a color reproduction range is expressed as an overlapping ratio (%) instead of a ratio (%) of a relative color gamut area, and the overlapping ratio (%) means a ratio (%) of a color gamut area overlapping a reference color gamut area.

The OLED 100 of this embodiment includes the light-absorption filter layer 200 located on the traveling direction of lights passing through the color filters 106*a*, 106*b* and 106*c*. Accordingly, a color reproduction range can be improved and the OLED 100 can satisfy 80% or more for BT. 2020.

TABLE 1

| | Color gamut | | |
| | overlapping ratio (%) for BT. 2020 | overlapping ratio (%) for DCI | Brightness efficiency (%) |
|---|---|---|---|
| Sample 1 | 73% | 97.8% | 100% |
| Sample 2 | 80% | 99% | 99% |
| Sample 3 | 90% | 99% | 75% |

Table 1 shows simulation results of measuring overlapping ratios for BT. 2020 of the OLED of this embodiment. Samples 2 and 3 are OLEDs 100 including the light-absorption filter layer 200, and are different in contents of the first and second absorption dyes 220*a* and 220*b* and have the same configuration.

Sample 1 is an OLED including no light-absorption filter layer 200.

Referring to Table 1, Sample 2 has a brightness efficiency similar to that of the Sample 1, and satisfies an overlapping ratio of 80% for BT. 2020 compared with Sample 1 merely satisfying an overlapping ratio of 73% for BT. 2020.

As such, since the OLED 100 of this embodiment includes the light-absorption filter layer 200 on the color filters 106*a*, 106*b* and 106*c*, a color reproduction range can be improved and the OLED 100 satisfies 80% or more for BT. 2020 that is a 4K/UHD standard advised by ITU.

Sample 3 satisfies an overlapping ratio of 90% for BT. 2020. As the contents of the first and second light-absorption dyes 220*a* and 220*b* increase, more clear red, green and blue lights can be output from the red, green and blue sub-pixels R-SP, G-SP and B-SP.

However, as the contents of the first and second light-absorption dyes 220*a* and 220*b* increase, an amount of a light absorbed by the first and second light-absorption dyes 220*a* and 220*b* increases and a brightness efficiency is reduced.

Figure 4A:
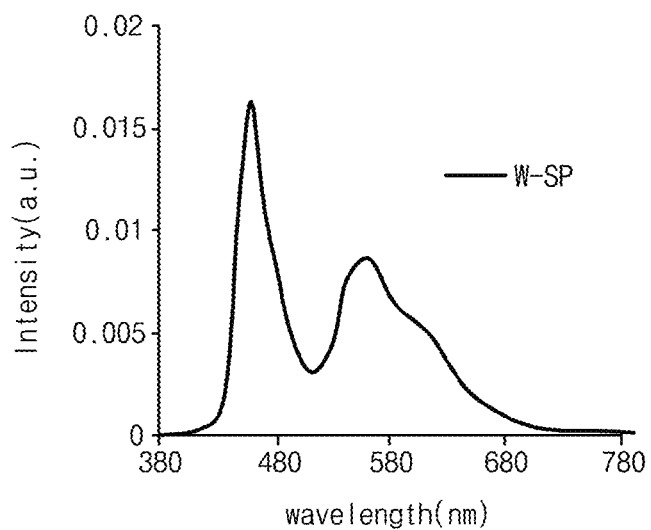
FIG. 4A is a graph showing a spectrum of a white light passing through a white sub-pixel in an OLED including no light-absorption filter layer.

In this embodiment, since the light-absorption filter layer 200 is arranged corresponding to the red, green and blue sub-pixels R-SP, G-SP and B-PS except for the white sub-pixel W-SP, a brightness of the OLED 100 may not be much influenced. FIG. 4A is a graph showing a spectrum of a white light passing through a white sub-pixel in an OLED including no light-absorption filter layer 200, and FIG. 4B is a graph showing a spectrum of a white light passing through the white sub-pixel W-SP in the OLED 100 including the light-absorption filter layer 200 according to the first embodiment of the present disclosure.

Figure 4B:
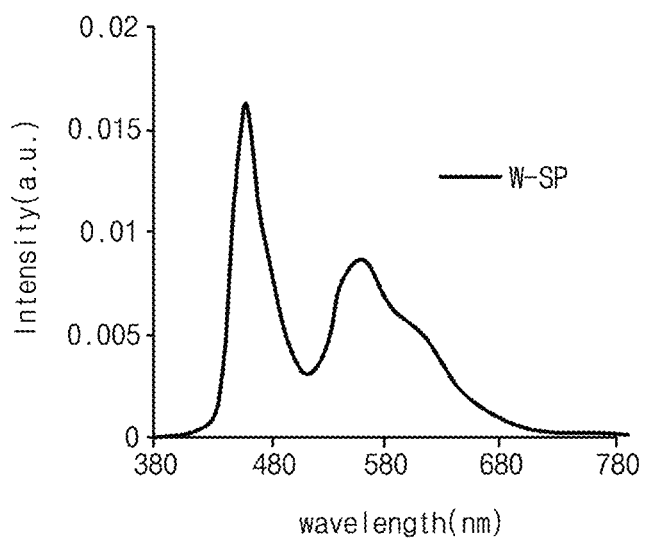
FIG. 4B is a graph showing a spectrum of a white light passing through a white sub-pixel in an OLED including a light-absorption filter layer according to a first embodiment of the present disclosure.

Referring to FIGS. 4A and 4B, the OLED 100 of this embodiment includes the light-absorption filter layer 200 on the traveling direction of the light passing through the color filters 106*a*, 106*b* and 106*c*, and the light-absorption filter layer 200 is not formed to correspond to the white sub-pixel W-SP. Accordingly, a white light from the white sub-pixel W-SP of this embodiment have substantially the same spectrum as a white light from the white sub-pixel of the OLED including no light-absorption filter layer 200.

The white light from the white sub-pixel W-SP contributes to a brightness of the OLED 100. Thus, even though the OLED 100 includes the light-absorption filter layer 200 corresponding to the red, green and blue sub-pixels R-SP, G-SP and B-SP, a loss of brightness by the white light output from the white sub-pixel W-SP is hardly made.

As described above, the OLED 100 of this embodiment includes the light-absorption filter layer 200 which is located on an output path of lights passing through the color filters 106*a*, 106*b* and 106*c*, and includes the first light-absorption dye 220*a* having a absorption wavelength range of about 470 nm to 550 nm and the second light-absorption dye 220*b* having a absorption wavelength range of about 570 nm to 620 nm. Thus, the OLED 100 can achieve a high brightness without loss of brightness, and can improve a color reproduction range and obtain 80% or greater for BT. 2020.

Even though not shown in the drawings, in case that the OLED 100 is configured as a top emission type display device, the light-absorption filter layer 200 is not located at the outer side of the substrate 101 but is located on the protective film 102 such that the light-absorption filter layer 200 is located on the emission direction of the light passing through the color filters 106*a*, 106*b* and 106*c*. In this case, a white light from the organic light emitting layer 113 passes through the color filter 106*a*, 106*b* or 106*c* and then passes through the light-absorption filter layer 200.

Further, a polarizing plate may be located on the substrate 101 or protective film 102 at the light output side in order to prevent reduction of a contrast by an external light.

In other words, when the OLED 100 is in a driving mode to display an image, the polarizing plate is formed on the transmission direction of light from the organic light emitting layer 113 and thus a contrast can increase.

The polarizing plate may be a circular polarizing plate to prevent an external light, and include a phase retardation plate and a linear polarizing plate. The phase retardation plate and the linear polarizing plate may be stacked such that the linear polarizing plate is located close to an incident side of an external light and the phase retardation plate is located at the inside of the linear polarizing plate.

The light-absorption filter layer 200 may be located on an outer surface of the substrate 101 or protective film 102, and the polarizing plate may be located on an outer surface of the light-absorption filter layer 200. Alternatively, the polarizing plate may be located on the substrate 101 or protective film 102, and the light-absorption filter layer 200 may be located on an outer surface of the polarizing plate.

The light-absorption filter layer 200 may be included as a component in the polarizing plate. For example, the light-absorption filter layer 200 may be located between the linear polarizing plate and the phase retardation plate.

Second Embodiment

Figure 5:
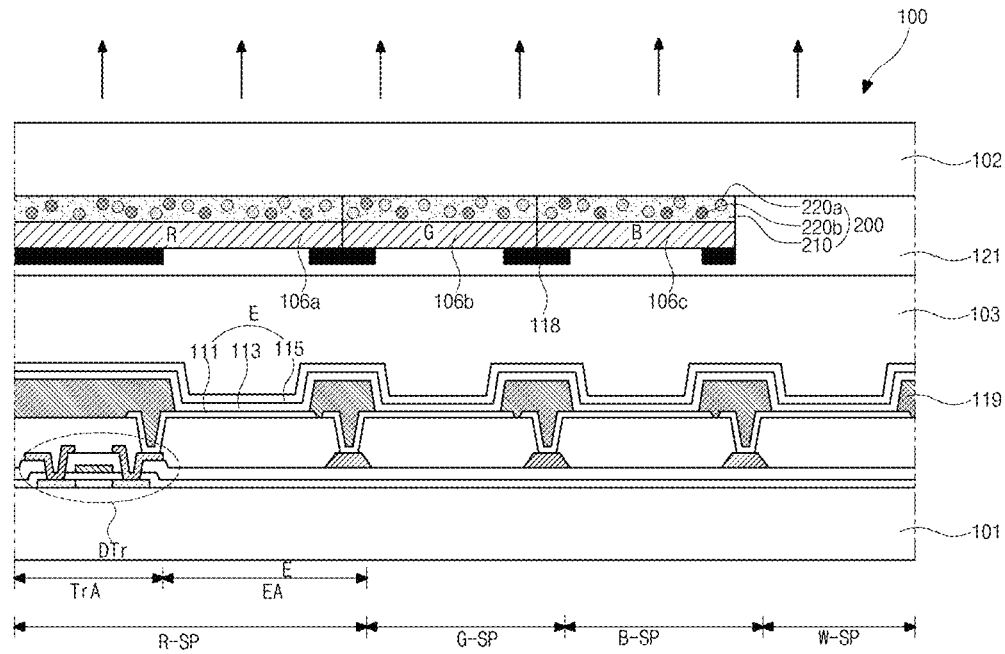
FIG. 5 is a cross-sectional view illustrating a structure of a unit pixel including four sub-pixels in an OLED according to a second embodiment of the present disclosure.

FIG. 5 is a cross-sectional view illustrating a structure of a unit pixel including four sub-pixels in an OLED according to a second embodiment of the present disclosure.

Explanations of the same or similar parts of the above embodiment may be omitted.

Referring to FIG. 5, the OLED 100 of this embodiment may include a first substrate 101 on which a driving TFT DTr and a light emitting diode E are formed, and a second substrate 102 facing the first substrate 101. The first and second substrates 101 and 102 may be coupled to each other using a protective layer 103 having an adhesion property to form the OLED 100.

On the first substrate 101, a switching TFT and the driving TFT DTr are formed in each of the sub-pixels R-SP, G-SP, B-SP and W-SP. A first electrode 111 is formed on the driving TFT DTr, an organic light emitting layer 113 is formed on the first electrode 111, and the second electrode 115 is formed on the organic light emitting layer 113.

The first and second electrodes 111 and 115, and the organic light emitting layer 113 forms the light emitting diode E. A bank 119 is located at a boundary of each sub-pixel and separates the sub-pixels R-SP, G-SP, B-SP and W-SP.

On an inner surface of the second substrate 102, red, green and blue color filters 106a, 106b and 106c may be formed to correspond to the respective sub-pixels R-SP, G-SP and B-SP, and a black matrix 118 surrounding each color filter and corresponding a boundary of each sub-pixel may be formed. A planarization layer 121 may be located on the red, green and blue color filters 106a, 106b and 106c and the black matrix 118.

The protective layer 103 is interposed between the first and second substrates 101 and 102. The protective layer 103 may be made of a transparent resin having a adhesion property.

In the OLED 100, when predetermined voltages are applied to the first electrode 111 and the second electrode 115, holes injected from the first electrode 111 and electrons injected from the second electrode 115 are transported to the organic light emitting layer 113 to form excitons. When the excitons are transitioned from an excited state to a ground state, light is generated and emitted in the form of visible light.

The OLED 100 of this embodiment may be a top emission type display device in which a light emitted from the organic light emitting layer 113 is output to the outside through the second electrode 115. In this case, a light from the organic light emitting layer 113 of the red sub-pixel R-SP realizes a red light while passing through the red color filter 106a. Similarly, a light from the organic light emitting layer 113 of the green sub-pixel G-SP realizes a green light while passing through the green color filter 106b, and a light from the organic light emitting layer 113 of the blue sub-pixel B-SP realizes a blue light while passing through the blue color filter 106c. In the white sub-pixel W-SP, a white light from the organic light emitting layer 113 passes through the planarization layer 121.

Accordingly, the OLED 100 can display a full color image.

The OLED 100 of this embodiment includes a light-absorption filter layer 200 between the second substrate 102 and the red, green and blue color filters 106a, 106b and 106c.

The light-absorption filter layer 200 may include first light-absorption dyes 220a and second light-absorption dyes 220b in a transparent resin 210. The first light-absorption dye 220a may has a absorption wavelength range of about 470 nm to 550 nm, and preferably, a absorption wavelength range of about 490 nm. The second light-absorption dye 220b may has a absorption wavelength range of about 570 nm to 620 nm, and preferably, a absorption wavelength range of about 590 nm.

The transparent resin 210 may be made of a binder resin. For example, the transparent resin 210 may be made of at least one selected from a group consisting of a polyester based binder resin, an acryl based binder resin, a polyurethane based binder resin, a melamine based binder resin, a polyvinyl alcohol based binder resin and a oxazoline based binder resin. Preferably, the transparent resin 210 may be made of an acryl based binder resin.

The first light-absorption dye 220a may be formed of pyrrol methin (PM) based light-absorption dye, rhodamin (RH) based light-absorption dye, or boron dipyrromethene (BODIBY) based light-absorption dye. The second light-absorption dye 220b may be formed of tetra aza porphyrin (TAP) based light-absorption dye, squarine (SQ) based light-absorption dye, or cyanine (CY) based light-absorption dye. Each of the first and second light-absorption dyes 220a and 220b may preferably use a combination of at least two selected from a group consisting of pyrrol methin (PM) based light-absorption dye, rhodamin (RH) based light-absorption dye, cyanine (CY) based light-absorption dye and tetra aza porphyrin (TAP) based light-absorption dye, and more preferably use a combination of cyanine (CY) based light-absorption dye and tetra aza porphyrin (TAP) based light-absorption dye.

The light-absorption filter layer 200 may correspond to the red, green and blue sub-pixels R-SP, G-SP and B-SP except for the white sub-pixel W-SP and be located on a transmission direction of lights which pass through the color filters 106a, 106b and 106c. Thus, the light-absorption filter layer 200 does not influence the white sub-pixel W-SP which much influences a brightness of the OLED 100, and improves a color reproduction range of lights emitted from the red, green and blue sub-pixels R-SP, G-SP and B-SP. The lights from the white, red, green, and blue sub-pixels W-SP, R-SP, G-SP, and B-SP are emitted through an emission surface on the second substrate 102.

Accordingly, the OLED 100 of this embodiment can achieve a high brightness without loss of light and improve a color reproduction range, and thus can satisfy 80% or more for BT. 2020.

Third Embodiment

FIG. 5 is a cross-sectional view illustrating a structure of a unit pixel including four sub-pixels in an OLED according to a third embodiment of the present disclosure.

Explanations of the same or similar parts of the above embodiments may be omitted.

The OLED 100 may be a top emission type display device or bottom emission type display device according to a light transmission direction. A bottom emission type OLED 100 is described by way of example.

Figure 6:
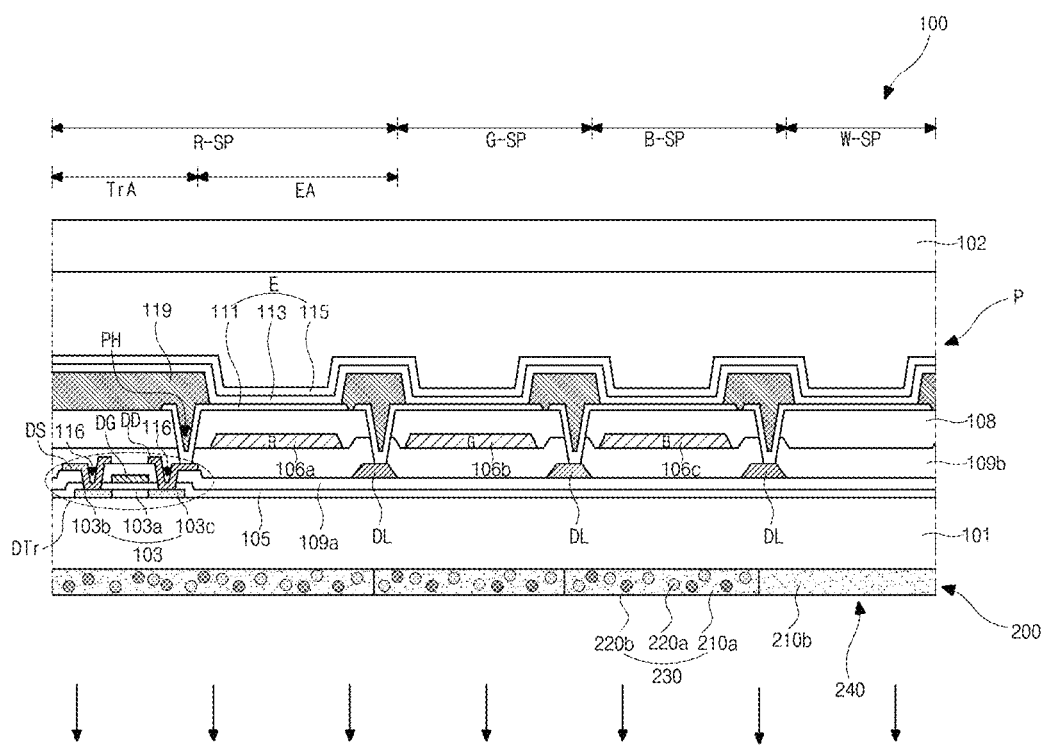
FIG. 6 is a cross-sectional view illustrating a structure of a unit pixel including four sub-pixels in an OLED according to a third embodiment of the present disclosure.

Referring to FIG. 6, in the OLED 100, the substrate 101 having a driving TFT DTr and a light emitting diode E may be encapsulated by a protective film 102.

The driving TFT DTr is formed at a switching region TrA in each sub-pixel. The driving TFT DTr includes source and drain electrodes DS and DD, a semiconductor layer 103 including source and drain regions 103b and 103c contacting the source and drain electrodes DS and DD, a gate insulating layer 105, and a gate electrode DG.

A first inter-layered insulating layer 109a may be located on the gate electrode DG. The first inter-layered insulating layer 109a and the gate insulating layer 105 may include first and second semiconductor contact holes 116 exposing the source and drain regions 103b and 103c, respectively.

The source and drain electrodes DS and DD may be formed on the first inter-layered insulating layer 109a and be spaced apart from each other. The source and drain electrodes DS and DD may contact the source and drain regions 103b and 103c through the first and second semiconductor contact holes 116, respectively.

A second inter-layered insulating layer 109b may be formed on the source and drain electrodes DS and DD, and the first inter-layered insulating layer 109a.

Even though not shown in FIG. 2, the switching TFT STr may have substantially the same structure as the driving TFT DTr.

The driving TFT DTr having a top gate structure with the semiconductor layer 103 formed as a polycrystalline silicon layer or oxide semiconductor layer is described by way of example. Alternatively, the driving TFT DTr and the switching TFT STr may have a bottom gate structure with the semiconductor layer 103 formed as an amorphous silicon layer.

If the semiconductor layer 103 uses an oxide semiconductor layer, a light shielding layer may be formed below the semiconductor layer 103, and a buffer layer may be formed between the light shielding layer and the semiconductor layer 103.

The substrate 101 may be made of a glass material. Alternatively, the substrate 101 may be made of a transparent plastic material such as a polyimide material, which is bendable or flexible. Polyimide having a high heat resistance may be preferred, considering that a high temperature deposition process is performed for the substrate 101. An entire surface of the substrate 101 may be covered with at least one buffer layer.

The driving thin film transistor DTr in the switching region TrA may have a characteristic in which a threshold voltage thereof is shifted by light. To prevent this, the OLED 100 of this embodiment may further include a light shielding layer provided below the semiconductor layer 103.

The light shielding layer is provided between the substrate 101 and the semiconductor layer 103 to block light incident on the semiconductor layer 103 through the substrate 101 and to minimize or prevent a change in a threshold voltage of a transistor caused by an external light. The light shielding layer may be covered with the buffer layer.

The color filters 106a, 106b and 106c may be formed on the second inter-layered insulating layer 109b corresponding to the respective emission regions EA of the red, green and blue sub-pixels R-SP, G-SP and B-SP.

The color filters 106a, 106b and 106c function to convert a white light emitted from the respectively organic light emitting layers 113. The red, green and blue color filters 106a, 106b and 106c are located at the emission regions EA of the red, green and blue sub-pixels R-SP, G-SP and B-SP, respectively.

At the emission region EA of the white sub-pixel W-SP, no color filter is formed, and a white light from the organic light emitting layer 113 is intactly transmitted.

Accordingly, in the OLED 100, the red, green, blue and white sub-pixels R-SP, G-SP, B-SP and W-SP emit red, green, blue and white colors so that a full color image of high brightness can be achieved. The lights from the white, red, green, and blue sub-pixels W-SP, R-SP, G-SP, and B-SP are emitted through an emission surface on the second substrate 102.

Each of the color filters 106a, 106b and 106c may include quantum dots which conduct an reemission according to a white light emitted from the organic light emitting layer 113 and have a size capable of emitting a light with a color set at each sub-pixel. The quantum dot may include at least one selected from a group consisting of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, InAlPAs and SbTe.

For example, the red color filter 106a of the red sub-pixel R-SP may include quantum dots of CdSe or InP, the green color filter 106b of the green sub-pixel G-SP may include quantum dots of CdZnSeS, and the blue color filter 106c of the blue sub-pixel B-SP may include quantum dots of ZnSe. The OLED 100 with the color filters 106a, 106b and 106c having the quantum dots can have a higher color reproduction range.

An overcoat layer 108 may be formed on the color filters 106a, 106b and 106c. The overcoat layer 108 and the second inter-layered insulating layer 109b may have a drain contact hole PH exposing the drain electrode DD of the driving TFT DTr.

The first electrode 111 is formed on the overcoat layer 108. The first electrode 111 is connected to the drain electrode DD of the driving TFT DTr through the drain contact hole PH. The first electrode 111 may be made of a material having a relatively high work function and serve as an anode.

The first electrode 111 may be made of a metal oxide material, for example, ITO, IZO or the like.

Each first electrode 111 may be patterned by each sub-pixel and be formed in each sub-pixel. The bank 119 may be located between the neighboring first electrodes 111. The first electrodes 111 may be separated from each other with the bank 119 as a boundary of each sub-pixel.

The bank 119 may be located between the neighboring first electrodes 111 and may separate the neighboring first electrodes 111 from each other.

The organic light emitting layer 113 may be formed on the first electrode 111. The organic light emitting layer 113 may be configured with a single layer made of an emitting material. Alternatively, to increase an emission efficiency, the organic light emitting layer 113 may be configured with multiple layers that may include a hole injection layer, a hole transport layer, an emitting material layer, an electron transport layer, and an electron injection layer.

The second electrode 115 may be formed entirely on the organic light emitting layer 113. The second electrode 115 may serve as a cathode.

The second electrode 115 may be made of a material having a relatively low work function. The second electrode 115 may be formed with a single layer or multiple layers using a first metal such as Ag and a second metal such as Mg, and the single layer may be made of an alloy of the first and second metals at a predetermined ratio thereof.

In the OLED 100, when predetermined voltages are applied to the first electrode 111 and the second electrode 115, holes injected from the first electrode 111 and electrons injected from the second electrode 115 are transported to the organic light emitting layer 113 to form excitons. When the excitons are transitioned from an excited state to a ground state, light is generated and emitted in the form of visible light.

As the OLED 100 of this embodiment is a bottom emission type display device. In this case, the second electrode 115 may further include a reflective layer (not shown) made of an opaque conductive material. For example, the reflective layer may be made of an aluminum-palladium-copper (APC) alloy, and the second electrode 115 may have a triple-layered structure of, for example, ITO/APC/ITO. Further, the first electrode 111 may have a thin thickness to transmit a light, and in this case, a light transmittance of the first electrode 111 may be about 45% to 50%.

The protective film 102 in the form of a thin film may be formed on the second electrode 115, and the OLED 100 may be encapsulated by the protective film 102.

The protective film 102 may be formed with at least two inorganic protective films to prevent or reduce external oxygen or moisture from permeating inside the OLED 100. In this case, the protective film 102 may further include an organic protective film between two inorganic protective films to supplement an impact resistance of the inorganic protective films.

In the structure that the organic protective film and the inorganic protective film are alternately stacked, in order to prevent an moisture or oxygen from permeating through a side surface of the organic protective film, the inorganic protective film may be formed to fully enclose the organic protective film.

Accordingly, an external moisture or oxygen can be prevented from permeating inside the OLED 100.

In the OLED 100 of this embodiment, a light-absorption filter layer 200 may be further formed on an outer side of the substrate 101.

The light-absorption filter layer 200 may include (or be divided into) a first light-absorption pattern 230 which is located to correspond to the red, green and blue sub-pixels R-SP, G-SP and B-SP, and a second light-absorption pattern 240 which is located to correspond to the white sub-pixel W-SP. The first and second light-absorption patterns 230 and 240 may form the same plane (or may be coplanar).

The first light-absorption pattern 230 may include first light-absorption dyes 220a and second light-absorption dyes 220b in a first transparent resin 210a. The first light-absorption dye 220a may has a absorption wavelength range of about 470 nm to 550 nm, and preferably, a absorption wavelength range of about 490 nm. The second light-absorption dye 220b may has a absorption wavelength range of about 570 nm to 620 nm, and preferably, a absorption wavelength range of about 590 nm.

The first transparent resin 210a may be made of a binder resin. For example, the transparent resin 210 may be made of at least one selected from a group consisting of a polyester based binder resin, an acryl based binder resin, a polyurethane based binder resin, a melamine based binder resin, a polyvinyl alcohol based binder resin and a oxazoline based binder resin. Preferably, the transparent resin 210 may be made of an acryl based binder resin.

The first light-absorption dye 220a may be formed of pyrrol methin (PM) based light-absorption dye, rhodamin (RH) based light-absorption dye, or boron dipyrromethene (BODIBY) based light-absorption dye. The second light-absorption dye 220b may be formed of tetra aza porphyrin (TAP) based light-absorption dye, squarine (SQ) based light-absorption dye, or cyanine (CY) based light-absorption dye. Each of the first and second light-absorption dyes 220a and 220b may preferably use a combination of at least two selected from a group consisting of pyrrol methin (PM) based light-absorption dye, rhodamin (RH) based light-absorption dye, cyanine (CY) based light-absorption dye and tetra aza porphyrin (TAP) based light-absorption dye, and more preferably use a combination of cyanine (CY) based light-absorption dye and tetra aza porphyrin (TAP) based light-absorption dye.

The second light-absorption pattern 240 may be formed of only second transparent resin 210b. The second transparent resin 210b may be made of a binder resin. For example, the transparent resin 210 may be made of at least one selected from a group consisting of a polyester based binder resin, an acryl based binder resin, a polyurethane based binder resin, a melamine based binder resin, a polyvinyl alcohol based binder resin and a oxazoline based binder resin. Preferably, the transparent resin 210 may be made of an acryl based binder resin.

The second transparent resin 210b may be made of the same material as the first transparent resin 210a. It is preferable that the first and second transparent resins 210a and 210b have a visible light transmittance of 98% or greater and the same refractive index.

The first and second transparent resins 210a and 210b may have a refractive index of about 1.7 to 2.1.

In the light-absorption filter layer 200, the first light-absorption pattern 230 including the first and second light-absorption dyes 220a and 220b is located to correspond to the red, green and blue sub-pixels R-SP, G-SP and B-SP, and the second light-absorption pattern 240 including no light-absorption dyes is located to correspond to the white sub-pixel W-SP. Thus, the light-absorption filter layer 200 does not influence the white sub-pixel W-SP which much influences a brightness of the OLED 100, and improves a color reproduction range of lights emitted from the red, green and blue sub-pixels R-SP, G-SP and B-SP.

Accordingly, the OLED 100 of this embodiment can achieve a high brightness without loss of light and improve a color reproduction range, and thus can satisfy 80% or more for BT. 2020.

Further, in the OLED 100 of this embodiment, since the first light-absorption pattern 230 including the first and second light-absorption dyes 220a and 220b is located to correspond to the red, green and blue sub-pixels R-SP, G-SP and B-SP, and the second light-absorption pattern 240 including no light-absorption dyes is located to correspond to the white sub-pixel W-SP, a screen distortion phenomenon caused by a refractive index difference between the white sub-pixel W-SP, and the red, green and blue sub-pixels R-SP, G-SP and B-SP can be prevented.

In this regard, when a light from the organic light emitting layer 113 passes through the color filters 106a, 106b or 106c and then is output to the outside, a light passing through the first light-absorption pattern 230 is refracted in a certain direction and then output due to a difference between a refractive index of the first transparent resin 210a of the first light-absorption pattern 230 and a refractive index of the outside (i.e., an air).

If the second light-absorption pattern 240 is not formed to correspond to the white sub-pixel W-SP, a refraction direction of a light emitted from the red, green and blue sub-pixels R-SP, G-SP and B-SP is different from a refraction direction of a light emitted from the white sub-pixel W-SP. Because of the difference of the light refraction direction, a screen distortion may happen.

However, in the OLED 100 of this embodiment, the second light-absorption pattern 240 formed of the second transparent resin 210b, which has transmittance and refractive index that are similar to those of the first transparent resin 210a of the first light-absorption pattern 230 corresponding to the red, green and blue sub-pixels R-SP, G-SP and B-SP, is located to correspond to the white sub-pixel W-SP. Accordingly, a screen distortion phenomenon caused by the light refraction direction difference between the white sub-pixel W-SP, and the red, green and blue sub-pixels R-SP, G-SP and B-SP can be prevented.

Further, in case that only the first light-absorption pattern 230 corresponding to the red, green and blue sub-pixels R-SP, G-SP and B-SP is used, a boundary between the red, green and blue sub-pixels R-SP, G-SP and B-SP where the first light-absorption pattern 230 is located, and the white sub-pixel W-SP where no light-absorption pattern is located may be distinctly recognized. This may cause a moire phenomenon by the boundaries of the first light-absorption patterns 230.

The moire phenomenon means that interference patterns are shown when periodic patterns are superimposed. As the boundaries of the first light-absorption patterns 230 are seen, the moire phenomenon may happen.

As the sub-pixels R-SP, G-SP, B-SP and W-SP of the OLED 100 become minute in order to realize a high resolution, the moire phenomenon intensifies. This is because that as the sub-pixels R-SP, G-SP, B-SP and W-SP of the OLED 100 become minute, the first light-absorption pattern 230 also becomes minute.

To reduce the moire phenomenon, it is preferable that the superimposed patterns, and more exactly the first light-absorption patterns 230 are formed with shape and period of the boundaries being random.

However, since the sub-pixels R-SP, G-SP, B-SP and W-SP are required to be periodic and repetitive, it is difficult to form the first light-absorption patterns 230 non-periodically and non-repetitively.

In the OLED 100 of this embodiment, the second light-absorption pattern 240, which has transmittance and refractive index similar to the first light-absorption pattern 230 corresponding to the red, green and blue sub-pixels R-SP, G-SP and B-SP, is formed to correspond to the white sub-pixel W-SP. Thus, the boundary of the first light-absorption pattern 230 may be recognized ambiguous. In the example shown in FIG. 6, lights emitted from the red, green, and blue sub-pixels R-SP, G-SP, and B-SP are emitted through an emission surface on the first light-absorption pattern 230 while light emitted from the white sub-pixel W-SP is emitted through an emission surface on the second light-absorption pattern 240.

Accordingly, the moire phenomenon due to the boundaries of the first light-absorption patterns 230 can be prevented or reduced.

Fourth Embodiment

Figure 7:
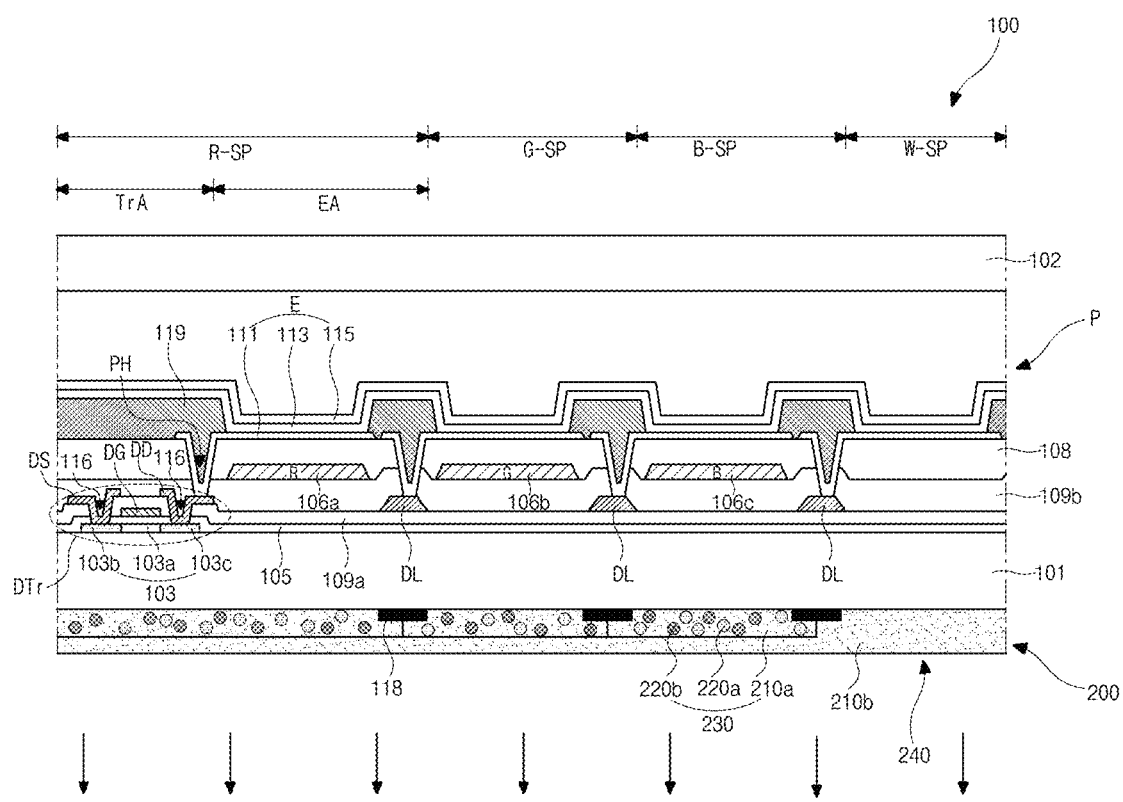
FIG. 7 is a cross-sectional view illustrating a structure of a unit pixel including four sub-pixels in an OLED according to a fourth embodiment of the present disclosure.

FIG. 7 is a cross-sectional view illustrating a structure of a unit pixel including four sub-pixels in an OLED according to a fourth embodiment of the present disclosure.

Explanations of the same or similar parts of the above embodiments may be omitted.

The OLED 100 may be a top emission type display device or bottom emission type display device according to a light transmission direction. A bottom emission type OLED 100 is described by way of example.

Referring to FIG. 7, in the OLED 100, the substrate 101 having a driving TFT DTr and a light emitting diode E may be encapsulated by a protective film 102.

On the first substrate 101, a switching TFT and the driving TFT DTr are formed in each of the sub-pixels R-SP, G-SP, B-SP and W-SP. A first electrode 111 is formed on the driving TFT DTr, an organic light emitting layer 113 is formed on the first electrode 111, and the second electrode 115 is formed on the organic light emitting layer 113.

The driving TFT DTr includes a semiconductor layer 103 including source and drain regions 103b and 103c, a gate insulating layer 105 and a gate electrode DG on the semiconductor layer 103, and source and drain electrodes DS and DD which are on a first inter-layered insulating layer 109a and contact the source and drain regions 103b and 103c through first and second semiconductor contact holes 116, respectively.

The color filters 106a, 106b and 106c may be formed on the second inter-layered insulating layer 109b, which is on the source and drain electrodes DS and DD, and correspond to respective emission regions EA of the red, green and blue sub-pixels R-SP, G-SP and B-SP.

The color filters 106a, 106b and 106c function to convert a white light emitted from the respective organic light emitting layers 113. The red, green and blue color filters 106a, 106b and 106c are located at the emission regions EA of the red, green and blue sub-pixels R-SP, G-SP and B-SP, respectively.

At the emission region EA of the white sub-pixel W-SP, no color filter is formed, and a white light from the organic light emitting layer 113 is intactly transmitted.

Accordingly, in the OLED 100, the red, green, blue and white sub-pixels R-SP, G-SP, B-SP and W-SP emit red, green, blue and white colors so that a full color image of high brightness can be achieved.

An overcoat layer 108 may be formed on the color filters 106a, 106b and 106c. The overcoat layer 108. The first electrode 111, the organic light emitting layer 113 and the second electrode 115 are located sequentially on the overcoat layer 108.

The first electrode 111 contacts the drain electrode DD of the driving TFT DTr through the drain contact hole PH. The first electrode 111, the organic light emitting layer 113 and the second electrode 115 constitute the light emitting diode E. The bank 119 may be located at a boundary of each sub-pixel and separate the sub-pixels R-SP, G-SP, B-SP and W-SP.

In the OLED 100 of this embodiment, a light-absorption filter layer 200 may be further formed on an outer side of the substrate 101.

The light-absorption filter layer 200 may include (or be divided into) a first light-absorption pattern 230 which is located to correspond to the red, green and blue sub-pixels R-SP, G-SP and B-SP, and a second light-absorption pattern 240 which is located to be on the first light-absorption pattern 230 and to correspond to the white sub-pixel W-SP.

The first light-absorption pattern 230 may include first light-absorption dyes 220a and second light-absorption dyes 220b in a first transparent resin 210a. The first light-absorption dye 220a may has a absorption wavelength range of about 470 nm to 550 nm, and preferably, a absorption wavelength range of about 490 nm. The second light-absorption dye 220b may has a absorption wavelength range of about 570 nm to 620 nm, and preferably, a absorption wavelength range of about 590 nm.

The first transparent resin 210a may be made of a binder resin. For example, the transparent resin 210 may be made of at least one selected from a group consisting of a polyester based binder resin, an acryl based binder resin, a polyurethane based binder resin, a melamine based binder resin, a polyvinyl alcohol based binder resin and a oxazoline based binder resin. Preferably, the transparent resin 210 may be made of an acryl based binder resin.

The first light-absorption dye 220a may be formed of pyrrol methin (PM) based light-absorption dye, rhodamin (RH) based light-absorption dye, or boron dipyrromethene (BODIBY) based light-absorption dye. The second light-absorption dye 220b may be formed of tetra aza porphyrin (TAP) based light-absorption dye, squarine (SQ) based light-absorption dye, or cyanine (CY) based light-absorption dye. Each of the first and second light-absorption dyes 220a and 220b may preferably use a combination of at least two selected from a group consisting of pyrrol methin (PM) based light-absorption dye, rhodamin (RH) based light-absorption dye, cyanine (CY) based light-absorption dye and tetra aza porphyrin (TAP) based light-absorption dye, and more preferably use a combination of cyanine (CY) based light-absorption dye and tetra aza porphyrin (TAP) based light-absorption dye.

The second light-absorption pattern 240 may be formed of only second transparent resin 210b. The second transparent resin 210b may be made of a binder resin. For example, the transparent resin 210 may be made of at least one selected from a group consisting of a polyester based binder resin, an acryl based binder resin, a polyurethane based binder resin, a melamine based binder resin, a polyvinyl alcohol based binder resin and a oxazoline based binder resin. Preferably, the transparent resin 210 may be made of an acryl based binder resin.

The second transparent resin 210b may be made of the same material as the first transparent resin 210a. It is preferable that the first and second transparent resins 210a and 210b have a visible light transmittance of 98% or greater and the same refractive index.

The first and second transparent resins 210a and 210b may have a refractive index of about 1.7 to 2.1.

In the light-absorption filter layer 200, the first light-absorption pattern 230 including the first and second light-absorption dyes 220a and 220b is located to correspond to the red, green and blue sub-pixels R-SP, G-SP and B-SP, and the second light-absorption pattern 240 including no light-absorption dyes is located to be on the first light-absorption pattern 230 and to correspond to the white sub-pixel W-SP. The second light-absorption pattern 240 contacts at least a surface of the first light-absorption pattern 230. Thus, the light-absorption filter layer 200 does not influence the white sub-pixel W-SP which much influences a brightness of the OLED 100, and improves a color reproduction range of lights emitted from the red, green and blue sub-pixels R-SP, G-SP and B-SP. In the example shown in FIG. 7, lights emitted from the white, red, green, and blue sub-pixels W-SP, R-SP, G-SP, and B-SP are emitted through an emission surface on the second light-absorption pattern 240.

Accordingly, the OLED 100 of this embodiment can achieve a high brightness without loss of light and improve a color reproduction range, and thus can satisfy 80% or more for BT. 2020.

Figure 8:
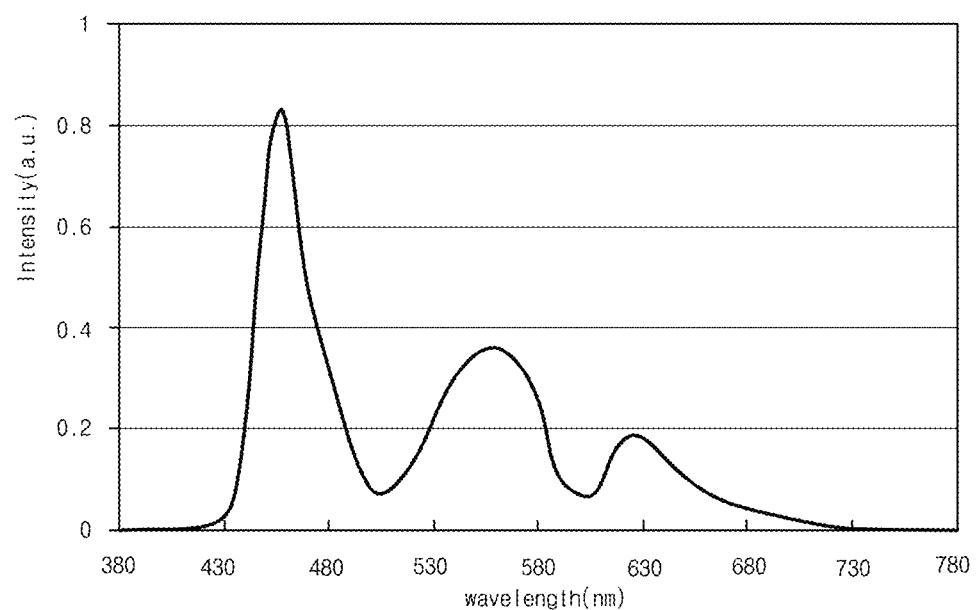
FIG. 8 is a graph showing a light transmission spectrum for an OLED according to a fourth embodiment of the present disclosure.

FIG. 8 is a graph showing a spectrum of a white light emitted from the organic light emitting diode 113 and passing through the light-absorption filter layer 200 including the first and second light-absorption patterns 230 and 240.

When the white light from the organic light emitting layer 113 passes through the light-absorption filter layer 200, a light of a wavelength range of about 470 nm to 550 nm and about 570 nm to 620 nm may be absorbed by the first light-absorption dyes 220a of the first light-absorption pattern 230, a transmittance at such the wavelength range may be reduced.

Thus, pure red, green and blue lights can be realized without color mixing regions.

As described above, in this embodiment, the light-absorption filter layer 200 including the first and second light-absorption patterns 230 and 240 is located on the transmission direction of a light passing through the color filters 106a, 106b and 106c. Therefore, the OLED 100 of this embodiment can improve a color reproduction range and satisfy 80% or more for BT. 2020.

TABLE 2

| | Overlapping ratio (%) for BT. 2020 | Brightness efficiency (%) |
|---|---|---|
| Sample 1 | 73% | 100% |
| Sample 2 | 80% | 99% |
| Sample 4 | 80.4% | 99% |

Table 2 shows simulation results of measuring overlapping ratios for BT. 2020 of the OLED of this embodiment. Sample 1 is an OLED including no light-absorption filter layer 200. Sample 2 is an OLED according to the first embodiment of the present disclosure. Sample 4 is an OLED according to the fourth embodiment of the present disclosure, which include the light absorption filter layer 200 including the first and second light-absorption patterns 230 and 240. Referring to Table 2, it is seen that Sample 4 i.e., the OLED 100 of this embodiment satisfies an overlapping ratio of 80.4% for BT. 2020.

Further, it is seen that the OLED 100 of this embodiment has a brightness efficiency close to that of Sample 1 i.e., the OLED with no light-absorption filter layer.

As such, the light-absorption filter layer 200 significantly influences improvement of a color reproduction range but does not significantly influences a brightness efficiency.

Accordingly, in this embodiment, since the light-absorption filter layer 200 including the first and second light-absorption patterns 230 and 240 is located on the transmission direction of a light passing through the color filters 106a, 106b and 106c, the OLED 100 can improve a color reproduction range and satisfy 80% or more for BT. 2020 that is a 4K/UHD standard advised by ITU.

Further, it is seen that a brightness efficiency of Sample 4 is not much different from that of Sample 2. This means that even though the second light-absorption pattern 240 is located on the first light-absorption pattern 230 in the OLED 100 of this embodiment, the second light-absorption pattern 240 does not influence a brightness efficiency.

Further, in the OLED 100 of this embodiment, the light-absorption filter layer 200 is configured such that the second light-absorption pattern 240 formed of the second transparent resin 210b, which has transmittance and refractive index that are similar to those of the first transparent resin 210a of the first light-absorption pattern 230 corresponding to the red, green and blue sub-pixels R-SP, G-SP and B-SP, is located to correspond to the white sub-pixel W-SP as well. Accordingly, a screen distortion phenomenon caused by a refractive index difference between the white sub-pixel W-SP, and the red, green and blue sub-pixels R-SP, G-SP and B-SP can be prevented.

Further, since the second light-absorption pattern 240 is located to correspond to the white sub-pixel W-SP, a moire phenomenon caused by a distinct recognition of a boundary between the red, green and blue sub-pixels R-SP, G-SP and B-SP where the first light-absorption pattern 230 is located can be prevented.

Further, since the second light-absorption pattern 240 is located even on the first light-absorption pattern 230, a recognition of a boundary of the first light-absorption pattern 230 that may be formed at each of the red, green and blue sub-pixels R-SP, G-SP and B-SP can be prevented.

In this regard, the first light-absorption pattern 230 may be formed singly (or integrally) to correspond to all of the red, green and blue sub-pixels R-SP, G-SP and B-SP. Alternatively, each first light-absorption pattern 230 may be patterned to correspond to each of the red, green and blue sub-pixels R-SP, G-SP and B-SP. When the first light-absorption patterns 230 may be respectively patterned at the red, green and blue sub-pixels R-SP, G-SP and B-SP, the first light-absorption patterns 230 are formed periodically and repetitively.

Figure 9A:
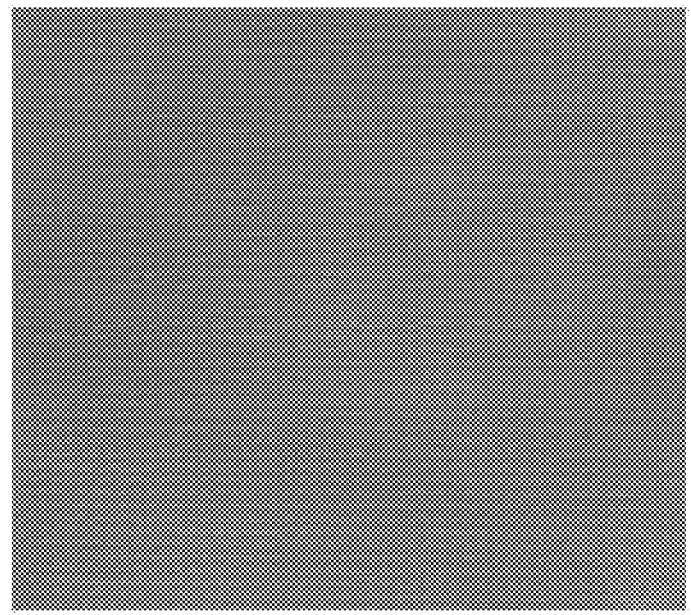
FIG. 9A is a picture showing a moire phenomenon.

In this case, as shown in FIG. 9A, a moire phenomenon may be seen.

Figure 9B:
FIG. 9B is a picture showing improvement of a moire phenomenon by an OLED according to a fourth embodiment of the present disclosure.

However, in this embodiment, the second light-absorption pattern 240 is located even on the first light-absorption pattern 230. Thus, as shown in FIG. 9B, the boundary of each first light-absorption pattern 230 may not be seen by the second light-absorption pattern 240.

Thus, the moire phenomenon due to the first light-absorption pattern 230 can be prevented or reduced.

Further, when the first light-absorption pattern 230 is formed at each of the red, green and blue sub-pixels R-SP, G-SP and B-SP, a black matrix 118 may be formed between the neighboring first light-absorption patterns 230 (or formed at the boundary of each first light-absorption patterns 230).

In the case that the black matrix 118 is formed between the neighboring first light-absorption patterns 230, a color mixing of lights of the red, green and blue sub-pixels R-SP, G-SP and B-SP when the lights passing through the first light-absorption patterns 230 can be prevented or reduced.

Further, in order to further increase an efficiency of a blue light emitted from the blue sub-pixel B-SP, the first light-absorption pattern 230 may be located to correspond to the red and green sub-pixels R-SP and G-SP except for the blue sub-pixel B-SP.

Even though not shown in the drawings, in case that the OLED 100 is configured as a top emission type display device, the light-absorption filter layer 200 is not located at the outer side of the substrate 101 but is located on the protective film 102 such that the light-absorption filter layer 200 is located on the emission direction of the light passing through the color filters 106a, 106b and 106c. In this case, a white light from the organic light emitting layer 113 passes through the color filter 106a, 106b or 106c and then passes through the light-absorption filter layer 200.

Further, a polarizing plate may be located on the substrate 101 or protective film 102 at the light output side in order to prevent reduction of a contrast by an external light.

In other words, when the OLED 100 is in a driving mode to display an image, the polarizing plate is formed on the transmission direction of light from the organic light emitting layer 113 and thus a contrast can increase.

The polarizing plate may be a circular polarizing plate to prevent an external light, and include a phase retardation plate and a linear polarizing plate. The phase retardation plate and the linear polarizing plate may be stacked such that the linear polarizing plate is located close to an incident side of an external light and the phase retardation plate is located at the inside of the linear polarizing plate.

The light-absorption filter layer 200 may be located on an outer surface of the substrate 101 or protective film 102, and the polarizing plate may be located on an outer surface of the light-absorption filter layer 200. Alternatively, the polarizing plate may be located on the substrate 101 or protective film 102, and the light-absorption filter layer 200 may be located on an outer surface of the polarizing plate.

The light-absorption filter layer 200 may be included as a component in the polarizing plate. For example, the light-absorption filter layer 200 may be located between the linear polarizing plate and the phase retardation plate.

Fifth Embodiment

Figure 10A:
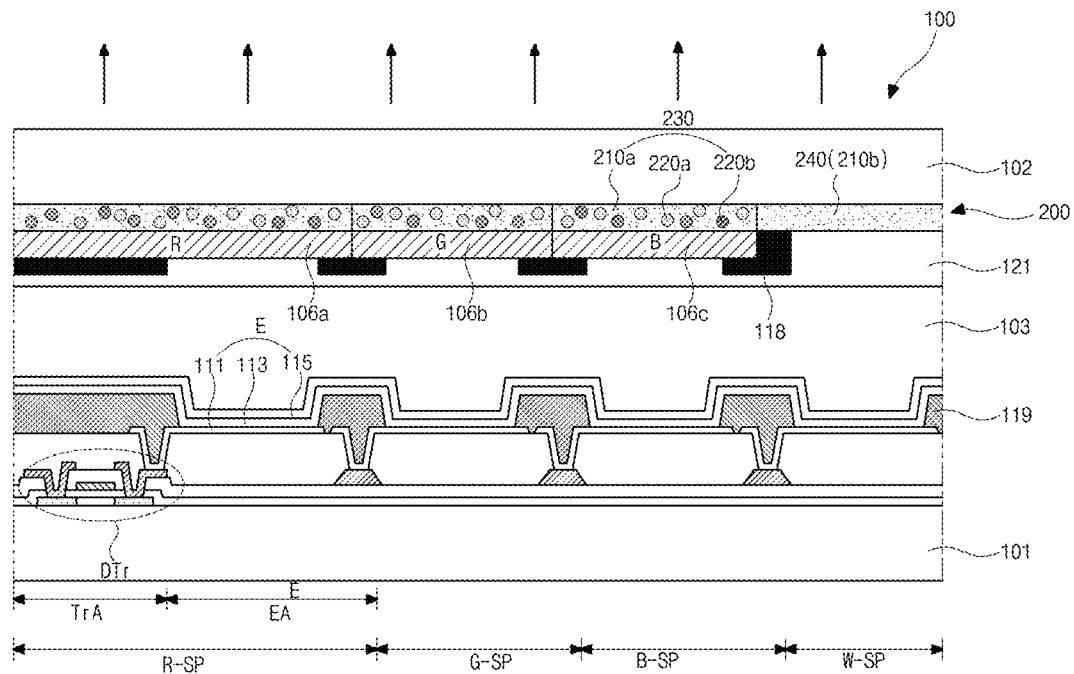
FIGS. 10A and 10B are cross-sectional views illustrating a structure of a unit pixel including four sub-pixels in each of OLEDs according to a fifth embodiment of the present disclosure.
Figure 10B:
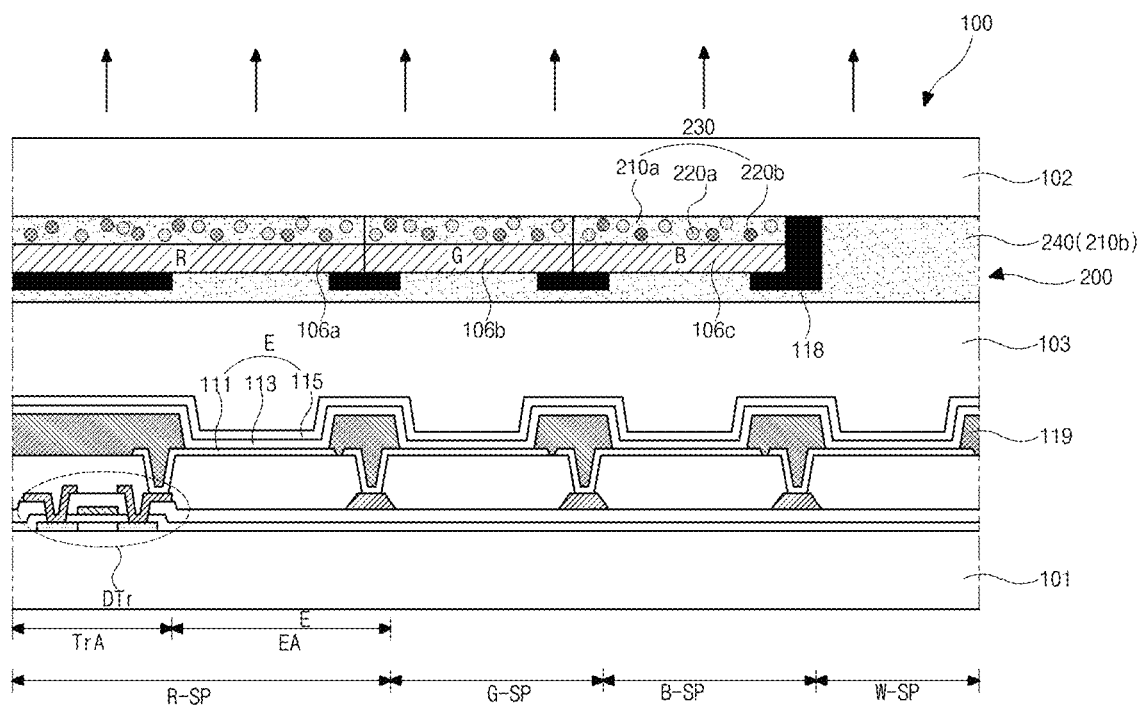

FIGS. 10A and 10B are cross-sectional views illustrating a structure of a unit pixel including four sub-pixels in each of OLEDs according to a fifth embodiment of the present disclosure.

Explanations of the same or similar parts of the above embodiments may be omitted.

Referring to FIGS. 10A and 10B, the OLED 100 of this embodiment may include a first substrate 101 on which a driving TFT DTr and a light emitting diode E are formed, and a second substrate 102 facing the first substrate 101. The first and second substrates 101 and 102 may be coupled to each other using a protective layer 103 having an adhesion property to form the OLED 100.

On the first substrate 101, a switching TFT and the driving TFT DTr are formed in each of the sub-pixels R-SP, G-SP, B-SP and W-SP. A first electrode 111 is formed on the driving TFT DTr, an organic light emitting layer 113 is formed on the first electrode 111, and the second electrode 115 is formed on the organic light emitting layer 113.

The first and second electrodes 111 and 115, and the organic light emitting layer 113 forms the light emitting diode E. A bank 119 is located at a boundary of each sub-pixel and separates the sub-pixels R-SP, G-SP, B-SP and W-SP.

On an inner surface of the second substrate 102, red, green and blue color filters 106a, 106b and 106c may be formed to correspond to the respective sub-pixels R-SP, G-SP and B-SP, and a black matrix 118 surrounding each color filter and corresponding a boundary of each sub-pixel may be formed.

The protective layer 103 is interposed between the first and second substrates 101 and 102. The protective layer 103 may be made of a transparent resin having a adhesion property.

In the OLED 100, when predetermined voltages are applied to the first electrode 111 and the second electrode 115, holes injected from the first electrode 111 and electrons injected from the second electrode 115 are transported to the organic light emitting layer 113 to form excitons. When the excitons are transitioned from an excited state to a ground state, light is generated and emitted in the form of visible light.

The OLED 100 of this embodiment may be a top emission type display device in which a light emitted from the organic light emitting layer 113 is output to the outside through the second electrode 115. In this case, a light from the organic light emitting layer 113 of the red sub-pixel R-SP realizes a red light while passing through the red color filter 106a. Similarly, a light from the organic light emitting layer 113 of the green sub-pixel G-SP realizes a green light while passing through the green color filter 106b, and a light from the organic light emitting layer 113 of the blue sub-pixel B-SP realizes a blue light while passing through the blue color filter 106c. In the white sub-pixel W-SP, a white light from the organic light emitting layer 113 passes through the planarization layer 121. The lights from the white, red, green, and blue sub-pixels W-SP, R-SP, G-SP, and B-SP are emitted through an emission surface on the second substrate 102.

Accordingly, the OLED 100 can display a full color image.

Referring to FIG. 10A, the OLED 100 of this embodiment may include a light-absorption filter layer 200 between the second substrate 102 and the red, green and blue color filters 106a, 106b and 106c.

The light-absorption filter layer 200 may include a first light-absorption pattern 230 which is located to correspond to the red, green and blue sub-pixels R-SP, G-SP and B-SP, and a second light-absorption pattern 240 which is located to correspond to the white sub-pixel W-SP. The first and second light-absorption patterns 230 and 240 may form the same plane.

To planarize the second substrate 102, a planarization layer 121 may be located on the red, green and blue color filters 106a, 106b and 106c and the black matrix 118.

Alternatively, referring to FIG. 10B, the first light-absorption pattern 230 may be formed between the second substrate 102 and the red, green and blue color filters 106a, 106b and 106c, and the second light-absorption pattern 240 may be formed to cover the white sub-pixel W-PS, the red, green and blue color filters 106a, 106b and 106c and the black matrix 118.

In other words, the second light-absorption pattern 240 may serve as a planarization layer to planarize the second substrate 102.

The first light-absorption pattern 230 may include first light-absorption dyes 220a and second light-absorption dyes 220b in a first transparent resin 210a. The first light-absorption dye 220a may has a absorption wavelength range of about 470 nm to 550 nm, and preferably, a absorption wavelength range of about 490 nm. The second light-absorption dye 220b may has a absorption wavelength range of about 570 nm to 620 nm, and preferably, a absorption wavelength range of about 590 nm.

The first transparent resin 210a may be made of a binder resin. For example, the transparent resin 210 may be made of at least one selected from a group consisting of a polyester based binder resin, an acryl based binder resin, a polyurethane based binder resin, a melamine based binder resin, a polyvinyl alcohol based binder resin and a oxazoline based binder resin. Preferably, the transparent resin 210 may be made of an acryl based binder resin.

The first light-absorption dye 220a may be formed of pyrrol methin (PM) based light-absorption dye, rhodamin (RH) based light-absorption dye, or boron dipyrromethene (BODIBY) based light-absorption dye. The second light-absorption dye 220b may be formed of tetra aza porphyrin (TAP) based light-absorption dye, squarine (SQ) based light-absorption dye, or cyanine (CY) based light-absorption dye. Each of the first and second light-absorption dyes 220a and 220b may preferably use a combination of at least two selected from a group consisting of pyrrol methin (PM) based light-absorption dye, rhodamin (RH) based light-absorption dye, cyanine (CY) based light-absorption dye and tetra aza porphyrin (TAP) based light-absorption dye, and more preferably use a combination of cyanine (CY) based light-absorption dye and tetra aza porphyrin (TAP) based light-absorption dye.

The second light-absorption pattern 240 may be formed of only second transparent resin 210b. The second transparent resin 210b may be made of a binder resin. For example, the transparent resin 210 may be made of at least one selected from a group consisting of a polyester based binder resin, an acryl based binder resin, a polyurethane based binder resin, a melamine based binder resin, a polyvinyl alcohol based binder resin and a oxazoline based binder resin. Preferably, the transparent resin 210 may be made of an acryl based binder resin.

The second transparent resin 210b may be made of the same material as the first transparent resin 210a. It is preferable that the first and second transparent resins 210a and 210b have a visible light transmittance of 98% or greater and the same refractive index.

The first and second transparent resins 210a and 210b may have a refractive index of about 1.7 to 2.1.

In the light-absorption filter layer 200, the first light-absorption pattern 230 including the first and second light-absorption dyes 220a and 220b is located to correspond to the red, green and blue sub-pixels R-SP, G-SP and B-SP, and the second light-absorption pattern 240 including no light-absorption dyes is located to correspond to the white sub-pixel W-SP or is located on the white sub-pixel W-SP, the color filters 106a, 106b and 106c and the black matrix 118. Thus, the light-absorption filter layer 200 does not influence the white sub-pixel W-SP which much influences a brightness of the OLED 100, and improves a color reproduction range of lights emitted from the red, green and blue sub-pixels R-SP, G-SP and B-SP.

Accordingly, the OLED 100 of this embodiment can achieve a high brightness without loss of light and improve a color reproduction range, and thus can satisfy 80% or more for BT. 2020.

Further, in the OLED 100 of this embodiment, the light-absorption filter layer 200 is configured such that the second light-absorption pattern 240 formed of the second transparent resin 210b, which has transmittance and refractive index that are similar to those of the first transparent resin 210a of the first light-absorption pattern 230 corresponding to the red, green and blue sub-pixels R-SP, G-SP and B-SP, is located to correspond to the white sub-pixel W-SP. Accordingly, a screen distortion phenomenon caused by a refractive index difference between the white sub-pixel W-SP, and the red, green and blue sub-pixels R-SP, G-SP and B-SP can be prevented. Further, since the second light-absorption pattern 240 is located to correspond to the white sub-pixel W-SP or is located on the white sub-pixel W-SP, the color filters 106a, 106b and 106c and the black matrix 118, a moire phenomenon caused by the first light-absorption pattern 230 can be prevented.

Even though not shown in the drawings, in order to prevent reduction of a contrast, a polarizing plate may be located on an outer surface of the second substrate 102.

In this case, the light-absorption filter layer 200 may be located between the second substrate 102 and the polarizing plate, or may be located on an outer surface of the polarizing plate.

The light-absorption filter layer 200 may be included as a component in the polarizing plate. For example, the light-absorption filter layer 200 may be located between the linear polarizing plate and the phase retardation plate which are included in the polarizing plate.

Further, in order to further increase an efficiency of a blue light emitted from the blue sub-pixel B-SP, the first light-absorption pattern 230 may be located to correspond to the red and green sub-pixels R-SP and G-SP except for the blue sub-pixel B-SP.

As described above, the OLED 100 of this embodiment includes the light-absorption filter layer 200 which is located on an output path of lights passing through the color filters 106a, 106b and 106c, and includes the first light-absorption dye 220a having a absorption wavelength range of about 470 nm to 550 nm and the second light-absorption dye 220b having a absorption wavelength range of about 570 nm to 620 nm. Thus, the OLED 100 can achieve a high brightness without loss of brightness, and can improve a color reproduction range and obtain 80% or greater for BT. 2020.

Further, in the OLED 100 of this embodiment, the light-absorption filter layer 200 is configured such that the second light-absorption pattern 240 formed of the second transparent resin 210b, which has transmittance and refractive index that are similar to those of the first transparent resin 210a of the first light-absorption pattern 230 corresponding to the red, green and blue sub-pixels R-SP, G-SP and B-SP, is located to correspond to the white sub-pixel W-SP. Accordingly, a screen distortion phenomenon caused by a refractive index difference between the white sub-pixel W-SP, and the red, green and blue sub-pixels R-SP, G-SP and B-SP can be prevented. Further, since the second light-absorption pattern 240 is located to correspond to the white sub-pixel W-SP or is located on the white sub-pixel W-SP, the color filters 106a, 106b and 106c and the black matrix 118, a moire phenomenon caused by the first light-absorption pattern 230 can be prevented.

Figure 11:
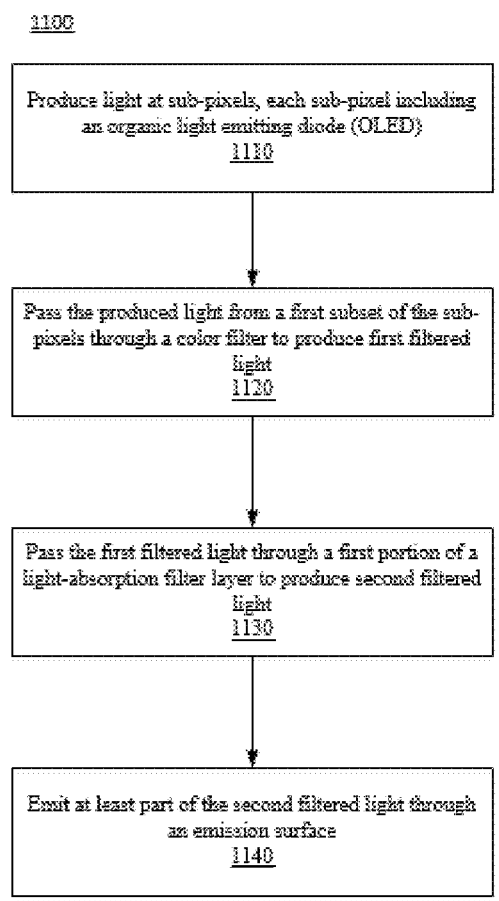
FIG. 11 is a flowchart showing a method of operating an OLED display device, according to an embodiment of the present disclosure.

FIG. 11 is a flowchart showing a method of operating an OLED display device, according to an embodiment of the present disclosure. The OLED display device includes pixels, each pixel including sub-pixels. The sub-pixels may include one or more of the following: white sub-pixel, red sub-pixel, blue sub-pixel, and green sub-pixel. Light is produced 1110 at sub-pixels, each sub-pixel including an OLED. The produced light from a subset of the sub-pixels (e.g., red, blue and green sub-pixels) is passed 1120 through a color filter to produce a first filtered light. The first filtered light is passed 1130 through a first portion of a light-absorption filter layer having a light transmittance curve that has a first valley between 470 nm and 550 nm and a second valley between 570 nm and 620 nm to produce a second filtered light. At least part of the second filtered light is emitted 1140 through an emission surface. The produced white light from pixels other than the subset of sub-pixels is passed through an emission surface. The produced white light may be passed through a second portion of the light-absorption filter layer, the second portion of the light-absorption filter layer having a same refractive index as that of the first portion.

It will be apparent to those skilled in the art that various modifications and variations can be made in the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
    an organic light emitting diode (OLED) comprising:
        a first electrode common to at least a subset of sub-pixels,
        second electrodes individually connected to each of the sub-pixels, and
        an organic light emitting layer between the first electrode and the second electrodes;
    an emission surface over the first electrode or the second electrodes;
    a first portion of a light-absorption filter layer between the OLED and the emission surface in a subset of sub-pixels, the first portion of the light absorption filter layer having a light transmittance curve that has a first valley covering at least a wavelength range of 470 nm to 550 nm, and a second valley covering at least a wavelength range of 570 nm to 620 nm; and
    a color filter between the OLED and the first portion of the light-absorption filter layer in the subset of sub-pixels,
    wherein white sub-pixels other than the subset of sub-pixels produce white light which passes through the emission surface.

2. The display device according to claim 1, further comprising:
    a second portion of the light-absorption filter layer between the OLED and the emission surface at the white sub-pixels, the second portion of light-absorption filter layer having a same refractive index as that of the first portion of the light-absorption filter layer.

3. The display device according to claim 2, wherein the second portion of the light-absorption filter layer contacts at least a surface of the first portion of the light-absorption filter layer.

4. The display device according to claim 1, wherein the subset of sub-pixels comprises:
    a red sub-pixel having a red color filter between the organic light emitting layer and the light-absorption filter layer,
    a green sub-pixel having a green color filter between the organic light emitting layer and the light-absorption filter layer, and
    a blue sub-pixel having a blue color filter between the organic light emitting layer and the light-absorption filter layer.

5. The display device according to claim 4, further comprising a pattern of a black matrix between adjacent ones of the sub-pixels.

6. The display device according to claim 4, further comprising a planarization layer on the red, green, and blue color filters and a second portion of the light-absorption filter layer that is between the OLED and the emission surface at the white sub-pixels.

7. The display device according to claim 1, wherein the first portion of light-absorption filter layer includes a first light-absorption dye and a second light-absorption dye each of which includes at least one of pyrrol methin (PM) based dye, rhodamin (RH) based dye, cyanine (CY) based dye and tetra aza porphyrin (TAP) based dye.

8. The display device according to claim 1, wherein the display device is a top-emission device, and the emission surface is over the first electrode.

9. The display device according to claim 1, the display device is a bottom-emission device, and the emission surface is over the second electrodes.

10. The display device according to claim 1, wherein each sub-pixel of the subset of sub-pixels includes a driving thin film transistor (TFT), the driving TFT including a semiconductor layer, a gate insulating layer on the semiconductor layer, a gate electrode on the gate insulating layer, an inter-layered insulating layer on the gate electrode, and source and drain electrodes on the inter-layered insulating layer.

11. The display device of claim 1, wherein the organic light emitting layer in each sub-pixel of the subset of sub-pixels emits a white light.

12. The display device of claim 1, wherein the first portion of the light-absorption filter layer in each sub-pixel of the subset of sub-pixels has the light transmittance curve that has the first valley covering at least the wavelength range of 470 nm to 550 nm, and the second valley covering at least the wavelength range of 570 nm to 620 nm.

13. A method of operating a display device, comprising:
    producing light at sub-pixels, each of the sub-pixels including an organic light emitting diode (OLED);
    passing the produced light from a subset of the sub-pixels through color filters to produce first filtered light;
    passing the first filtered light through a first portion of a light-absorption filter layer having a light transmittance curve that has a first valley covering at least a wavelength range of 470 nm to 550 nm, and a second valley covering at least a wavelength range of 570 nm to 620 nm to produce second filtered light;

emitting at least a part of the second filtered light through an emission surface of the display device; and passing white light produced by sub-pixels other than the subset of the sub-pixels through the emission surface.

14. The method of claim 13, wherein passing the white light comprises passing the produced light through a second portion of light-absorption filter layer having a same refractive index as that of the first portion of light-absorption filter layer.

15. The method of claim 13, wherein passing the produced light from the subset of the sub-pixels comprises:

passing a first portion of the produced light from a red sub-pixel of the subset of sub-pixels through a red color filter;

passing a second portion of the produced light from a green sub-pixel of the subset of sub-pixels through a green color filter; and passing a third portion of the produced light from a blue sub-pixel of the subset of sub-pixels through a blue color filter.

16. The method of claim 13, further comprising driving a driving thin film transistor (TFT) for each of the sub-pixels to produce the light.

17. The method of claim 13, wherein the OLED in each of the sub-pixels emits a white light.

18. The method of claim 13, wherein the first portion of the light-absorption filter layer in each sub-pixel of the subset of the sub-pixels has the light transmittance curve that has the first valley covering at least the wavelength range of 470 nm to 550 nm, and the second valley covering at least the wavelength range of 570 nm to 620 nm.

* * * * *